(12) United States Patent
Honda

(10) Patent No.: US 6,696,764 B2
(45) Date of Patent: Feb. 24, 2004

(54) FLIP CHIP TYPE SEMICONDUCTOR DEVICE AND METHOD OF MANUFACTURING THE SAME

(75) Inventor: Hirokazu Honda, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 10/347,761

(22) Filed: Jan. 22, 2003

(65) Prior Publication Data

US 2003/0137057 A1 Jul. 24, 2003

(30) Foreign Application Priority Data

Jan. 24, 2002 (JP) .......................... 2002-016234
Nov. 26, 2002 (JP) .......................... 2002-343000

(51) Int. Cl.⁷ .......................... H01L 23/48; H01L 23/52; H01L 29/40
(52) U.S. Cl. .......................... 257/778; 257/783; 257/698; 438/108
(58) Field of Search .......................... 257/750, 758, 257/698, 783, 706, 707, 778; 438/108, 121, 125

(56) References Cited

U.S. PATENT DOCUMENTS

| 5,751,060 | A | * | 5/1998 | Laine et al. |
| 6,018,196 | A | * | 1/2000 | Noddin |
| 6,320,267 | B1 | * | 11/2001 | Yukawa |
| 6,406,942 | B2 | * | 6/2002 | Honda |
| 6,528,892 | B2 | * | 3/2003 | Calctka et al. |

FOREIGN PATENT DOCUMENTS

| JP | 2000-323620 | 11/2000 |
| JP | 2001-203237 | 7/2001 |

\* cited by examiner

Primary Examiner—Sheila V. Clark
(74) Attorney, Agent, or Firm—Young & Thompson

(57) ABSTRACT

Multilayer thin film wirings are formed on both front and back surfaces of a base substrate that is made of a metal or alloy plate. The base substrate is cut into the front surface side and the back surface side. Then, the base substrates are selectively removed to expose inner electrode pads, on which flip chip type semiconductor chips are mounted.

37 Claims, 18 Drawing Sheets

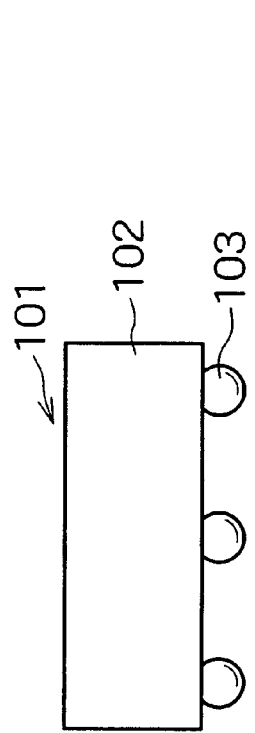
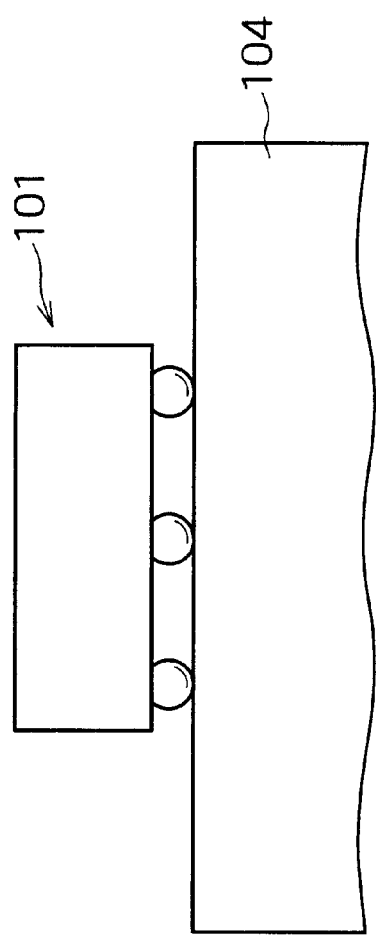
FIG. 1A (PRIOR ART)
FIG. 1B (PRIOR ART)

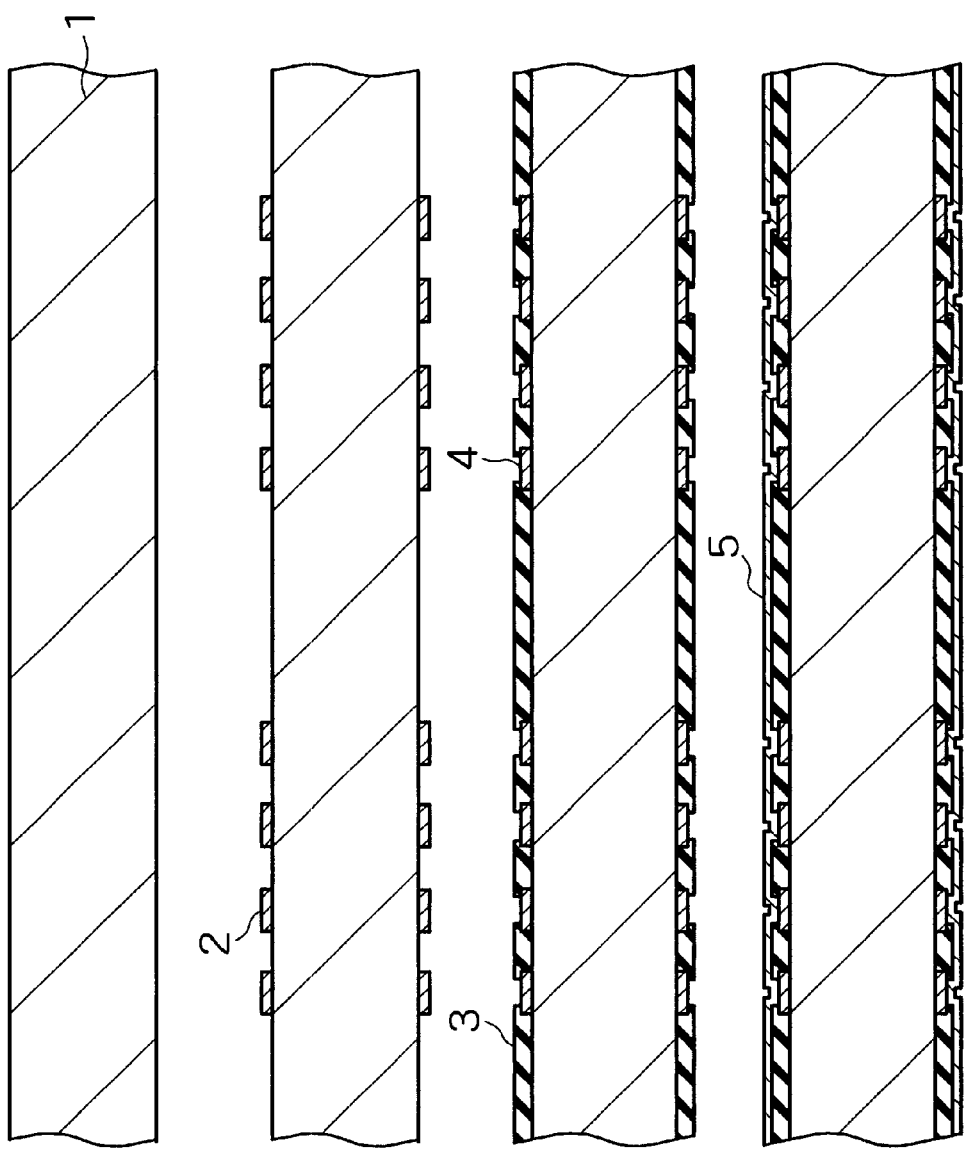

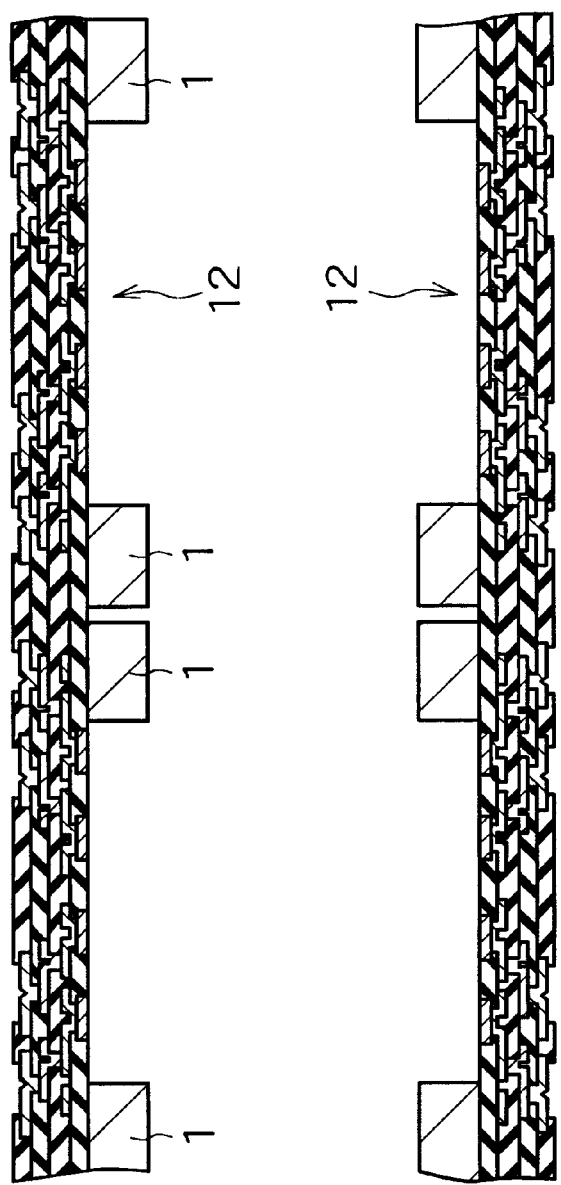

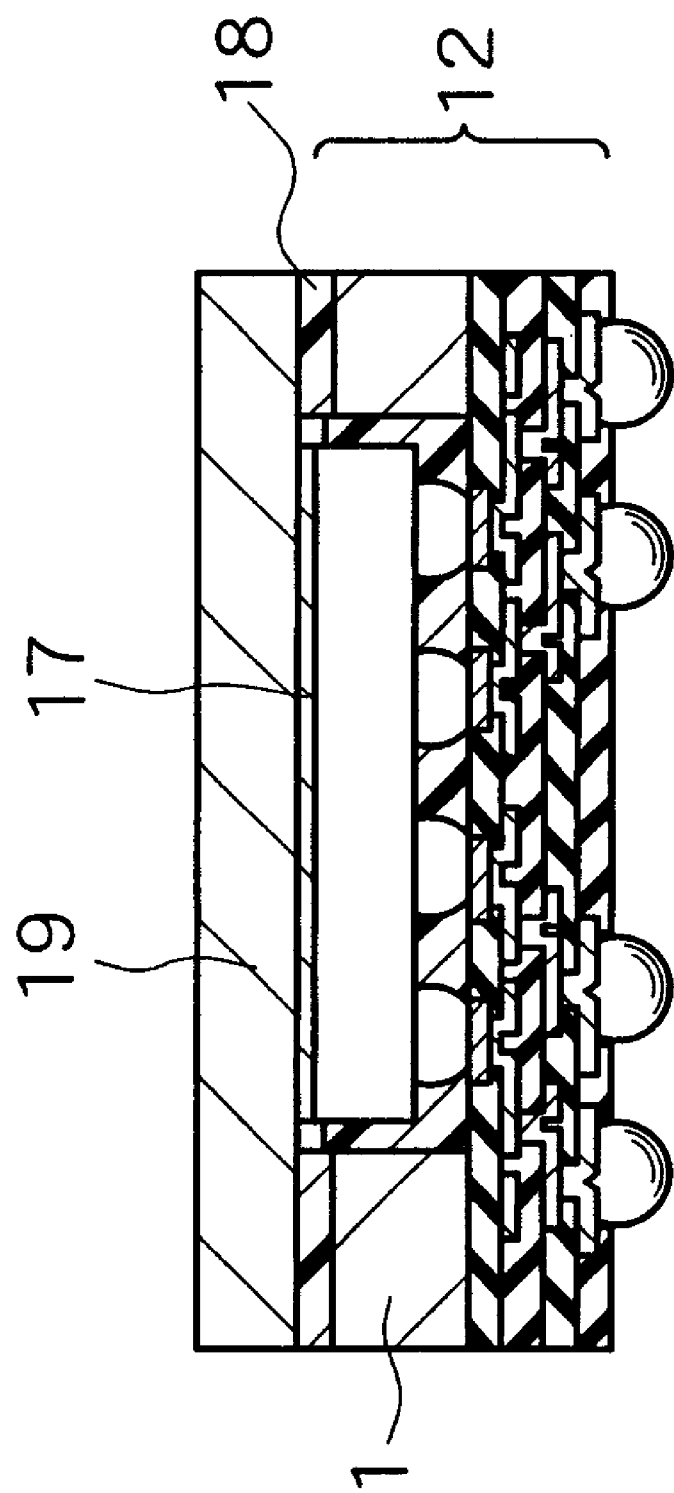

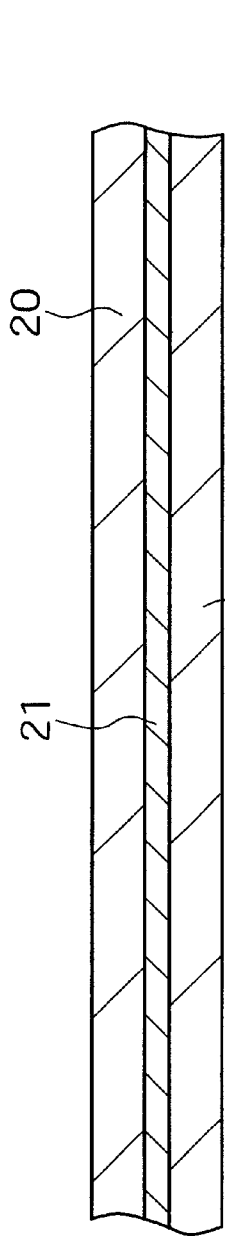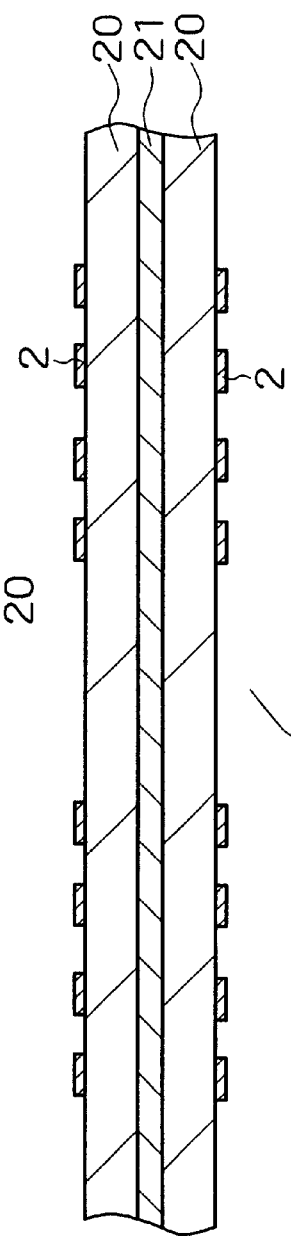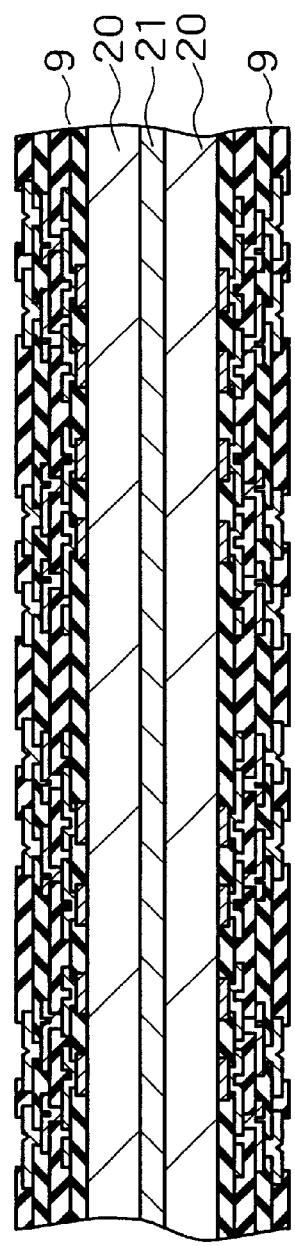

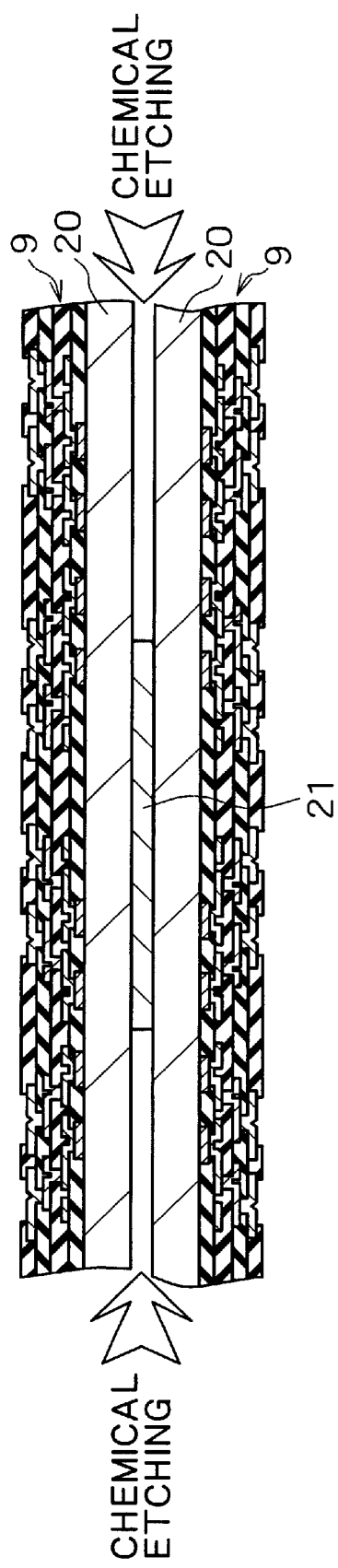
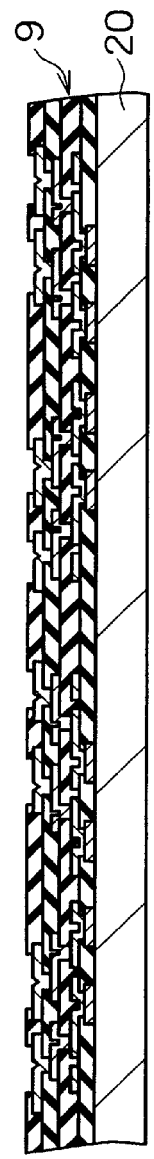
FIG.12A
FIG.12B

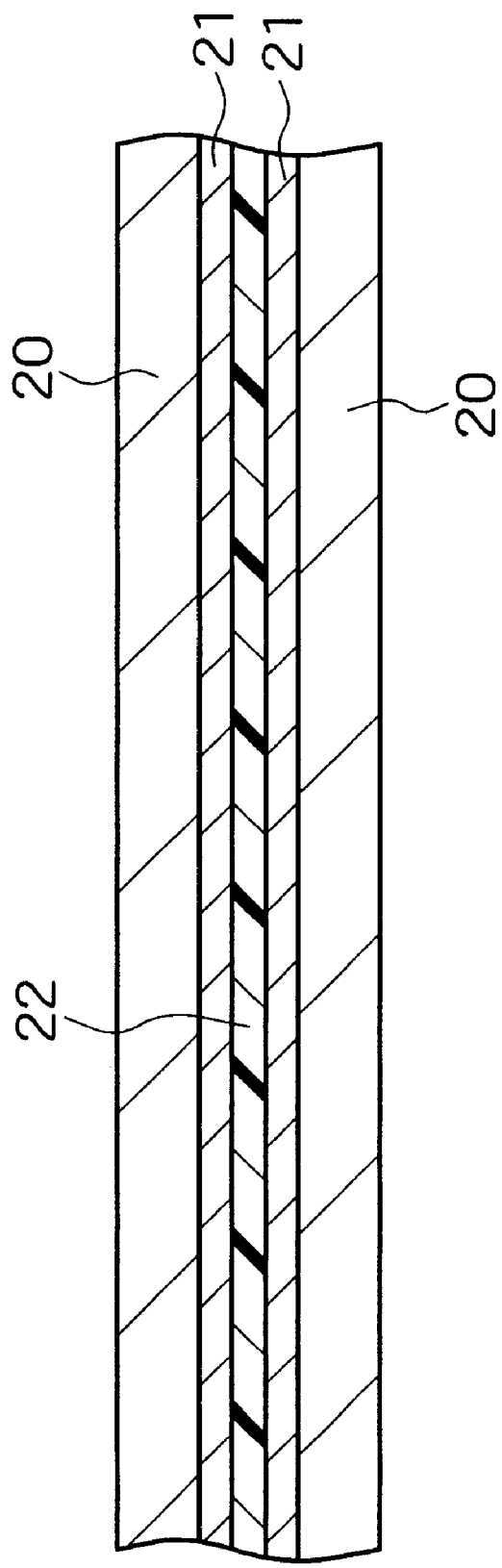

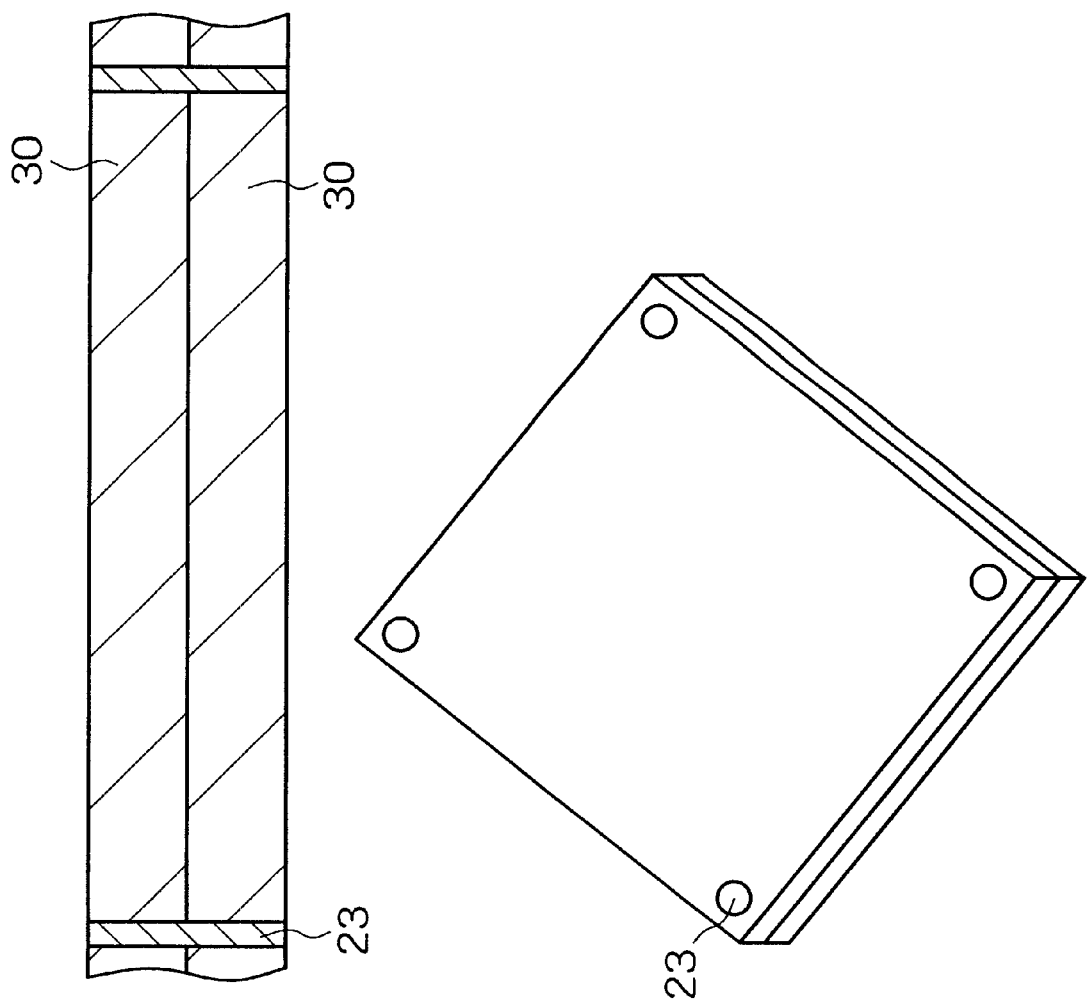

OVERALL CHEMICAL ETCHING

FLIP CHIP TYPE SEMICONDUCTOR DEVICE AND METHOD OF MANUFACTURING THE SAME

BACKGROUND OF THE INVENTION

1. Field of the Invention

The present invention relates to a flip chip type semiconductor device having a semiconductor chip mounted on its multilayer wiring board and a method of manufacturing the same. In particular, the present invention relates to a flip chip type semiconductor device and a method of manufacturing the same, that is low in manufacturing cost and capable of reducing the wiring pattern pitch of the multilayer wiring board to 10 μm or less.

2. Description of the Related Art

FIGS. 1A and 1B are side views showing a conventional flip chip type semiconductor device 101. The flip chip type semiconductor device 101 shown in FIG. 1A has a semiconductor chip 102, on the peripheral region or active region of which external terminals (not shown) are formed in an area array. Bumps 103 of metal material such as solder, Au, or an Sn—Ag alloy are formed as protruded from the external terminals.

As shown in FIG. 1B, the flip chip type semiconductor device 101 is mounted on a multilayer wiring mounting board 104. The multilayer wiring mounting board 104 has electrode pads (not shown) that are formed in the same pattern as the arrangement pattern of the bumps on the flip chip type semiconductor device 101. The flip chip type semiconductor device 101 is mounted on the multilayer wiring mounting board 104 by end users with the bumps 103 in alignment with the electrode pads. When the bumps are made of solder, the flip chip type semiconductor device 101 is typically mounted on the multilayer wiring mounting board 104 by an IR reflow process using flux.

The conventional flip chip type semiconductor device 101, however, has the problem that after the mounting on the multilayer wiring mounting board 104, it deteriorates in mounting reliability, or temperature cycle characteristics in particular, due to a mismatch in the coefficient of linear expansion between the multilayer wiring mounting board 104 and the flip chip type semiconductor device 101. To solve this problem, the following measures have been taken heretofore.

First, it has been attempted to bring the coefficient of linear expansion of the multilayer wiring mounting board 104 close to that of silicon. For example, as disclosed in Japanese Patent Laid-Open Publication No. 2000-323620, ceramic type materials such as AlN, mullite, and glass ceramic, which are expensive, are used to minimize the mismatch in the coefficient of linear expansion for the sake of improved mounting reliability. This attempt is effective in terms of improvement in mounting reliability, whereas the use of the expensive ceramic type materials for the multilayer wiring board usually limits the applications to high-end super computers, large scale computers, and the like.

On the contrary, as disclosed in Japanese Patent Laid-Open Publication No. 2001-203237, for example, there has recently been proposed a technology capable of improving the mounting reliability in which a flip chip type semiconductor device is packaged with an underfill resin interposed between a multilayer wiring board made of inexpensive organic material having a high coefficient of linear expansion and a semiconductor chip. When an underfill resin is thus arranged between the semiconductor chip and the multilayer wiring board made of organic material, shearing stress acting on the bump connecting portions lying between the semiconductor chip and the multilayer wiring board made of organic material can be dispersed for improved mounting reliability. The interposition of the underfill resin between the semiconductor chip and the organic-material multilayer wiring board thus allows the use of the multilayer wiring board that is made of inexpensive organic material.

This conventional art, however, has the problem that the interface between the underfill resin and the semiconductorchip and the interface between the underfill resin and the organic-material multilayer wiring board might suffer delamination and the product might be judged to be defective in a moisture absorption reflow test if the underfill resin contains voids or if the interfaces are poor in adhesive properties. It is therefore impossible for this conventional art to promote a cost reduction of the flip chip type semiconductor device with reliability.

In consideration of the minimum pitch in a bump arrangement pattern and the pin counts, a multilayer wiring board so-called build-up board is typically used as the organic-material multilayer wiring board of the flip chip type semiconductor device. Hereinafter, the method of manufacturing a build-up board will be described with reference to FIGS. 2A through 3C. FIGS. 2A through 2C are sectional views of a conventional build-up board, showing the method of manufacturing the same in the order of steps. FIGS. 3A through 3C are sectional views showing the steps subsequent to that of FIG. 2C.

In FIG. 2A, a Cu foil layer 111 having a predetermined thickness such as 10 to 40 μm is initially pasted on both sides of a core substrate 110 of insulative glass epoxy material, followed by patterning. A hole is drilled in the core substrate 110 before through-hole plating is applied to the interior of the hole, thereby forming a through hole part 112. As a result, the Cu foil layers 111 on both sides of the core substrate 110 are electrically connected with each other. Here, in view of the process stability in the subsequent steps and the quality stability of the substrate, the through hole part 112 is typically filled with an insulative through hole filling resin 113.

As shown in FIG. 2B, an insulative resin 114 is applied to the Cu wiring patterns lying on both sides of the core substrate 110. Insulative resin openings 115 are formed in predetermined positions by photoresist-based chemical etching or a laser machining technique.

As shown in FIG. 2C, metal thin film layers 116 are formed by sputtering metal such as Ti and Cu or through Cu electroless plating, in order that electric connection shall be secured between feed layers intended for Cu electroplating and Cu wiring pattern parts on the core substrate.

As shown in FIG. 3A, photoresists 117 or dry films having a thickness of 20 to 40 μm are arranged on the metal thin film layers 116 and then subjected to exposure and development for the sake of wiring pattern formation through Cu electroplating.

As shown in FIG. 3B, wiring pattern parts 118 are formed by Cu electroplating with the metal thin film layers 116 as the feed layers.

As shown in FIG. 3C, the photoresists 117 or dry films are removed. Using the wiring pattern parts 118 as a mask, the metal thin film layers 116 are then removed by wet etching, so that the wiring pattern parts 118 are electrically independent of each other.

Subsequently, the steps of FIGS. 2B to 3C can be repeated to form a multilayer wiring board having a six- or eight-layer metal structure if needed.

Considering a relaxation of stress resulting from a mismatch in the coefficient of thermal expansion with the core substrate and reliabilities of the multilayer wiring board such as that of the connection via portions, however, the foregoing method of manufacturing a build-up board requires that the photoresists 117 or dry films have a thickness of around 20 to 40 μm to secure the thickness of the build-up layer wiring pattern portions. Thus, in terms of pattern formability at the exposure and development steps, a minimum pitch of 30 μm or so can only be achieved at best. This results in a wiring pattern pitch no smaller than 30 μm or so, which precludes higher densities of the multilayer wiring board and smaller outside dimensions of the board. In typical manufacturing processes, build-up boards are fabricated together on a large panel of approximately 500 mm×600 mm, and then cut into individual pieces of multilayer wiring boards in the final step. The number of pieces producible per panel can thus be increased if each multilayer wiring board is successfully reduced in outer dimensions. In the current method of manufacturing a build-up board, however, the wiring pattern pitch mentioned above can only be reduced to 30 μm or so at best. It is thus impossible to reduce the outside dimensions of each single multilayer wiring board and to lower the cost of the multilayer wiring board significantly.

The method of manufacturing a multilayer wiring board also has a problem of warpage. The core substrate 110 has a warp, which causes a misalignment of resist patterns in the exposure and development steps for forming the build-up wiring patterns. Such a misalignment leads to a drop in manufacturing yield.

To suppress the warpage of the core substrate, build-up layers must be formed on both sides of the core substrate. It is therefore necessary to form a build-up wiring layer that is essentially needless. As a result, the organic multilayer wiring board must have excessive layers with a drop in manufacturing yield, which is the contributing factor to hinder a reduction in manufacturing cost.

SUMMARY OF THE INVENTION

It is an object of the present invention to provide a flip chip type semiconductor device and a method of manufacturing the same in which a multilayer wiring board having a wiring pattern pitch as fine as 10 μm or less can be manufactured at high yield and low cost, no excessive layer is required, and thin films having advantageous electric properties are provided.

A method of manufacturing a flip chip type semiconductor device according to a first aspect of the present invention includes the steps of: forming multilayer thin film wirings on both front and back surfaces of a base substrate having body parts made of metal or an alloy at both the front and back surfaces, each of the multilayer thin film wirings including an inner electrode pad formed on a surface of the multilayer thin film wiring close to the base substrate and an outer electrode pad formed on an opposite surface not close to the base substrate; splitting the base substrate into the front surface side and the back surface side to form two base substrate integrated type wiring boards; removing at least part of the body parts of the base substrates to expose the electrode pad; and mounting a plurality of flip chip type semiconductor chips on the inner electrode pad of the multilayer thin film wiring so that bump electrodes thereof are connected with the inner electrode pad.

In the present invention, the multilayer thin film wirings are formed on the base substrate made of metal or an alloy. Hence, the multilayer thin film wirings improve in flatness. It is therefore possible to form a multilayer wiring board having a wiring pattern pitch as fine as 10 μm or less. After the multilayer thin film wirings are formed on both front and back surfaces of the base substrate, the base substrate is split into the front surface side and the back surface side, to form two base substrate integrated type wiring boards. This eliminates the need for forming multilayer wiring layers that are intended to suppress substrate warpage. Since the multilayer thin film wirings formed can be used efficiently and the multilayer thin film wirings can be formed on both the front and back surfaces of the base substrate in a single process, the flip chip type semiconductor device can be manufactured at high yield and low cost.

In the method of manufacturing a flip chip type semiconductor device, according to a second aspect of the invention, solder balls are joined to the outer electrode pad of the multilayer thin film wiring.

According to a third aspect of the invention, the multilayer thin film wiring is separated by each of the semiconductor chips.

According to a fourth aspect of the invention, the step of exposing the inner electrode pad includes the steps of: applying a photoresist to surfaces of the base substrates so as not to cover regions consistent with the electrode pad; and etching off the base substrates with the photoresist as a mask, thereby forming stiffener integrated type multilayer thin film wiring boards having the remaining portions of the base substrates as stiffener parts.

According to a fifth aspect of the invention, in the step of exposing the inner electrode pad, the base substrates are entirely removed to obtain multilayer thin film wirings in film form exposing the inner electrode pad, and after the step, stiffener parts are joined to at least part of the surface of the multilayer thin film wiring from which the base substrates are removed, excluding regions consistent with the inner electrode pad.

According to a sixth aspect of the invention, the stiffener parts are made of metal or an alloy.

According to a seventh aspect of the invention, a resin is filled into between the semiconductor chips and the stiffener parts and between the semiconductor chips and the multilayer thin film wiring after the semiconductor chips are mounted.

According to an eighth aspect of the invention, a heat spreader for cooling the semiconductor chip is joined to each of the semiconductor chips.

According to a ninth aspect of the invention, the inner electrode pad of the multilayer thin film wiring are plated layers formed by electroplating with the base substrate as a feed layer.

According to a tenth aspect of the invention, the base substrate is made of copper, a copper alloy, or stainless steel.

According to an eleventh aspect of the invention, the base substrate is separated into two base substrate integrated type wiring boards by being cut practically in parallel with its surface.

According to a twelfth aspect of the invention, the base substrate has a three-layer structure including metal or alloy body parts on both front and back surfaces and an intermediate metal layer laminated therebetween; and in the step of splitting the base substrate, the intermediate metal layer is etched more selectively than the body parts to separate the base substrate into two.

According to a thirteenth aspect of the invention, a porous film is laminated on the intermediate metal layer.

According to a fourteenth aspect of the invention, the base substrate has a five-layer structure including metal or alloy body parts on both front and back surfaces and a three-layer film arranged therebetween, the three-layer film having two intermediate metal layers and a porous film sandwiched therebetween.

According to a fifteenth aspect of the invention, the base substrate is prepared by stacking two single-layer metal plates made of metal or an alloy, and fixing the single-layer metal plates to each other with a metal or alloy pin sticking therethrough.

According to a sixteenth aspect of the invention, the base substrate is prepared by stacking two single-layer metal plates made of metal or an alloy, and fixing the single-layer metal plates to each other by local welding.

According to a seventeenth aspect of the invention, the base substrate is prepared by stacking two single-layer metal plates made of metal or an alloy, and fixing the single-layer metal plates to each other by mechanical binding at their edges.

According to an eighteenth aspect of the invention, the base substrate is prepared by stacking two single-layer metal plates made of metal or an alloy, and fixing the single-layer metal plates to each other by local bonding with an adhesive.

A flip chip type semiconductor device according to a nineteenth aspect of the invention includes: multilayer thin film wirings including an inner electrode pad formed on one side thereof and an outer electrode pad formed on the other; and a flip chip type semiconductor chips mounted on the multilayer thin film wiring so that a bump electrode thereof is connected with the inner electrode pad of the multilayer thin film wiring, the multilayer thin film wirings being formed by forming the multilayer thin film wirings on both front and back surfaces of a base substrate having body parts made of metal or an alloy at both the front and back surfaces, each of the multilayer thin film wiring including an inner electrode pad formed on a surface of the multilayer thin film wiring closer to the base substrate and an outer electrode pad formed on an opposite surface not close to the base substrate, and then splitting the base substrate into the front surface side and the back surface side, and removing at least part of the body parts of the base substrates to expose the inner electrode pad.

In the flip chip type semiconductor device, according to a twentieth aspect of the invention, the multilayer thin film wiring is separated by semiconductor chip after the semiconductor chip is mounted thereon.

According to a twenty-first aspect of the invention, a stiffener part is made of the base substrate remaining in a region of the multilayer thin film wiring where the semiconductor chip is not mounted on. An insulative sealing resin is arranged between the semiconductor chip and the stiffener part and between the semiconductor chip and the multilayer thin film wiring.

According to a twenty-second aspect of the invention, solder balls are joined to the outer electrode pad of the multilayer thin film wiring.

According to a twenty-third aspect of the invention, a heat spreader for cooling is joined to the semiconductor chip.

According to a twenty-fourth aspect of the invention, the heat spreader is made of a material selected from the group consisting of metallic materials including Cu, Al, W, Mo, Fe, Ni, and Cr, and ceramic materials including alumina, AlN, SiC, and mullite.

According to a twenty-fifth aspect of the invention, the heat spreader is joined to the semiconductor chip with a heat conductive adhesive including, as a main component, a resin selected from the group consisting of epoxy resins, silicone resins, polyimide resins, polyolefin resins, cyanate ester resins, phenol resins, and naphthalene resins, and further including a material selected from the group consisting of Ag, Pd, Cu, Al, Au, Mo, W, diamond, alumina, AlN, mullite, BN, and SiC.

According to a twenty-sixth aspect of the invention, the multilayer thin film wiring is a wiring layer having a multilayer structure formed by forming and patterning an insulative resin thin film and forming and pattering a conductive thin film.

According to a twenty-seventh aspect of the invention, the insulative resin thin film includes, as a main component, a resin selected from the group consisting of epoxy resins, silicone resins, polyimide resins, polyolefin resins, cyanate ester resins, phenol resins, and naphthalene resins.

According to a twenty-eighth aspect of the invention, the multilayer thin film wiring has a metal two-layer structure including: the inner electrode pad; an insulative resin thin film formed to cover the inner electrode pad, having an opening in part of a region consistent with the inner electrode pad; the outer electrode pad formed on the insulative resin thin film and connected to the inner electrode pad through the opening; and a solder resist film for covering an end of the outer electrode pad. According to a twenty-ninth aspect of the invention, the multilayer thin film wiring has a total thickness of 52 to 266 $\mu$m.

According to a thirtieth aspect of the invention, the multilayer thin film wiring has a metal three-layer structure including the inner electrode pad, a first insulative resin thin film, a wiring part, a second insulative resin thin film, the outer electrode pad, and the solder resist film. According to a thirty-first aspect of the invention, the multilayer thin film wiring has a total thickness of 77 to 396 $\mu$m.

According to a thirty-second aspect of the invention, the multilayer thin film wiring has a metal four-layer structure including the inner electrode pad, a first insulative resin thin film, a first wiring part, a second insulative resin thin film, a second wiring part, a third insulative resin thin film, the outer electrode pad, and the solder resist film. According to a thirty-third aspect of the invention, the multilayer thin film wiring has a total thickness of 102 to 526 $\mu$m.

According to a thirty-fourth aspect of the invention, the multilayer thin film wiring has a metal five-layer structure including the inner electrode pad, a first insulative resin thin film, a first wiring part, a second insulative resin thin film, a second wiring part, a third insulative resin thin film, a third wiring part, a fourth insulative resin thin film, the outer electrode pad, and the solder resist film. According to a thirty-fifth aspect of the invention, the multilayer thin film wiring has a total thickness of 127 to 656 $\mu$m.

According to a thirty-sixth aspect of the invention, the multilayer thin film wiring has a metal six-layer structure including the inner electrode pad, a first insulative resin thin film, a first wiring part, a second insulative resin thin film, a second wiring part, a third insulative resin thin film, a third wiring part, a fourth insulative resin thin film, a fourth wiring part, a fifth insulative resin thin film, the outer electrode pad, and the solder resist film. According to a thirty-seventh aspect of the invention, the multilayer thin film wiring has a total thickness of 152 to 786 $\mu$m.

As described above, according to the present invention, the multilayer thin film wirings are formed on the base substrate that has high flatness. It is therefore possible to form fine wiring which can maintain the high flatness, shows excellent thermal stability during the formation of the multilayer thin film wiring, has high manufacturing yield, and is 10 μm or less in line & space. If the base substrate has a large warp as heretofore, the depth of focus of pattern exposure tends to vary, contributing to manufacturing processes poor in stability. This means technical limitations in terms of fine pattern formability and in view of a drastic improvement in manufacturing cost.

In the present invention, the multilayer thin film wiring can be formed on both front and back surfaces of the base substrate and semiconductor chips can be mounted thereon before the base substrate is split in two to produce two semiconductor devices out of the two surfaces of the base substrate. Then, the production per a single manufacturing process becomes double to allow a significant improvement in manufacturing efficiency with the result of a large reduction in manufacturing cost.

In the method of forming a wiring pattern of the multilayer wiring board according to the present invention, the metal thin film wiring need not necessarily be thickened to around 10–30 μm as with build-up boards in the conventional art. Moreover, it is possible to utilize a method and a system for metalizing a semiconductor wafer. The photoresist and the metal thin film wiring parts can thus be easily processed in a thinner range of 1 μm and below, which facilitates making the wiring patterns finer. With the facilitation of finer wiring patterns, it becomes possible to increase the density of the organic multilayer wiring boards and reduce the outside dimensions of each single multilayer wiring board for a significant reduction in cost. The application of a metal plate(s) to the base substrate significantly reduces the production of waste that matters in conventional printed-wiring boards. This is extremely advantageous in improving manufacturing yield.

Furthermore, when a wafer-shaped base substrate is used, a plurality of packages can be fabricated by wafer-level processes. As compared to packaging methods in which each package is fabricated from a piece, the manufacturing steps can thus be reduced significantly with a large reduction in cost.

BRIEF DESCRIPTION OF THE DRAWINGS

FIGS. 1A and 1B are side views of a conventional flip chip type semiconductor device;

FIGS. 4A through 4D are sectional views of a flip chip type semiconductor device according to a first embodiment of the present invention, showing the method of manufacturing the same in the order of steps;

FIGS. 8A and 8B are sectional views showing the steps subsequent to that of FIG. 7C;

FIG. 10 is a sectional view showing a method of manufacturing a flip chip type semiconductor device according to a second embodiment of the present invention;

FIGS. 11A through 11C are sectional views of a flip chip type semiconductor device according to a third embodiment of the present invention, showing the method of manufacturing the same in the order of steps;

FIGS. 12A and 12B are sectional views showing the steps subsequent to that of FIG. 1C;

FIG. 13 is a sectional view showing a method of manufacturing a flip chip type semiconductor device according to a fourth embodiment of the present invention;

FIG. 14A is a sectional view showing a method of manufacturing a flip chip type semiconductor device according to a fifth embodiment of the present invention, and FIG. 14B is a perspective view thereof;

DETAILED DESCRIPTION OF THE PREFERRED EMBODIMENTS

Figure 2A:
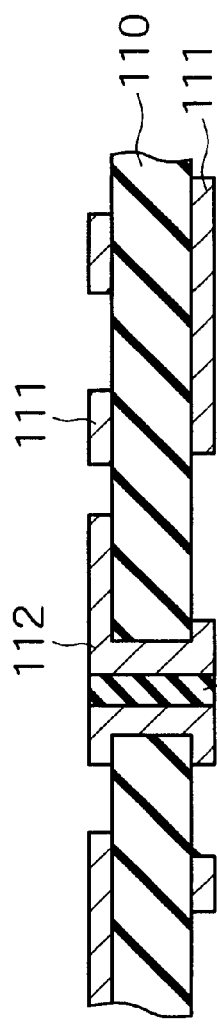
FIGS. 2A through 2C are sectional views of a conventional build-up substrate, showing the method of manufacturing the same in the order of steps.
Figure 2B:
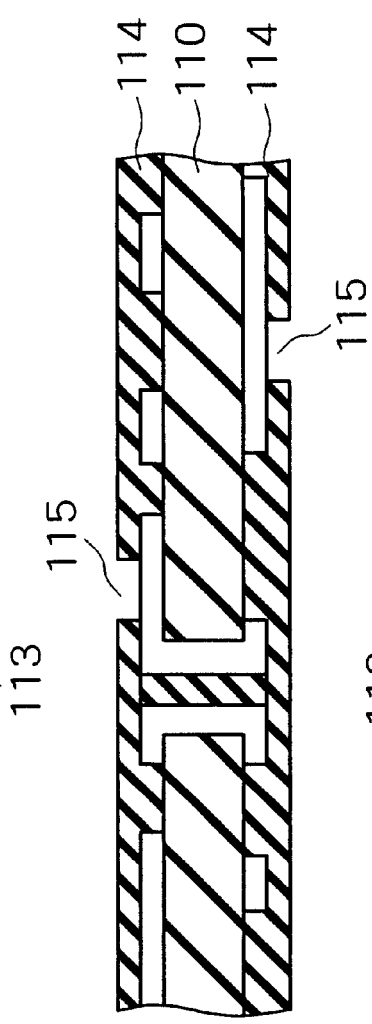
Figure 2C:
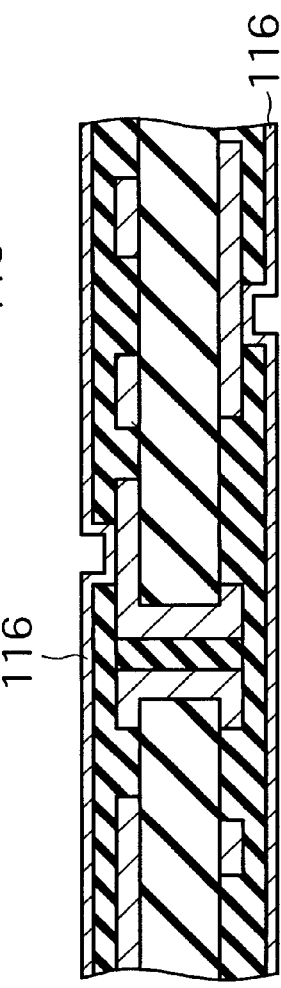
Figure 3A:
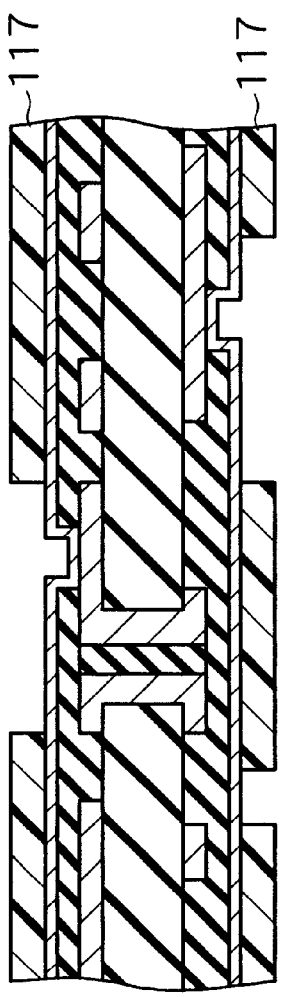
FIGS. 3A through 3C are sectional views showing the steps subsequent to that of FIG. 2C.
Figure 3B:
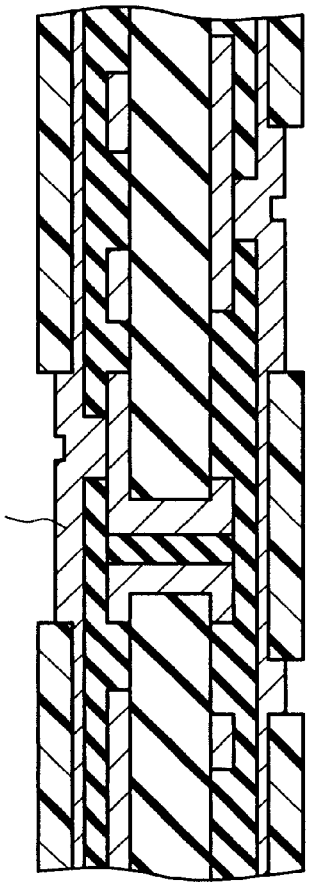
Figure 3C:
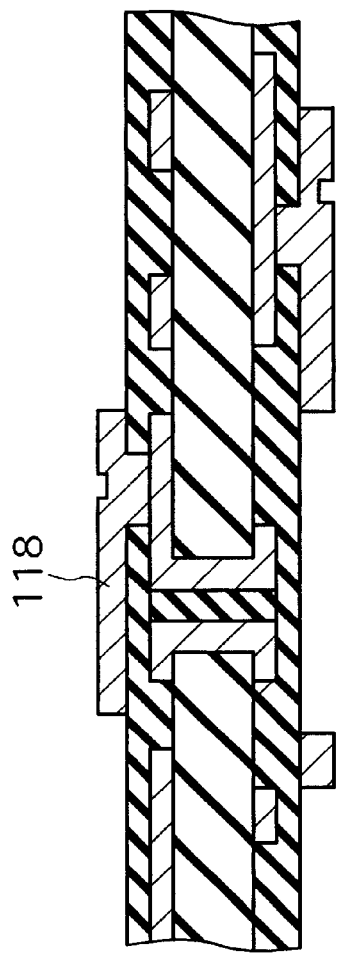

Hereinafter, embodiments of the present invention will be described in detail with reference to the accompanying drawings. FIGS. 4A through 9C are sectional views of a flip chip type semiconductor device according to a first embodiment of the present invention, showing the method of manufacturing the same in the order of steps. Initially, as shown in FIG. 4A, a base substrate 1 having high flatness and high mechanical strength is prepared. The material of the base substrate 1 is comprised of stainless steel (SUS) and such metal as Cu or an alloy thereof.

Next, as shown in FIG. 4B, electrode pad parts 2 are formed on both sides of the base substrate 1. The electrode pad parts 2 can be formed in the following manner. The base substrate 1 is coated with a photoresist, followed by exposure and development to form a resist pattern. An Au layer, an Ni layer, a Cu layer, and the like are successively formed on the base substrate 1 by electroplating in which the portions of the base substrate 1 not covered under the resist function as a feed layer. This forms a triple plated layer, for example. Then, the photoresist can be removed to form the electrode pad parts 2 of predetermined pattern. Here, the individual layers of the triple plated layer (Au layer/Ni layer/Cu layer) constituting the electrode pad parts 2 are given thicknesses such that the Au layer is around 0.3–3 μm, the Ni layer 1–10 μm, and the Cu layer 10–50 μm. The total thickness of the triple plated layer is 11.3 to 63 μm, for example.

Next, as shown in FIG. 4C, insulative resin thin film layers 3 for covering the electrode pad parts 2 are formed on both sides of the substrate 1 on which the electrode pad parts 2 are formed. The insulative resin thin film layers 3 can be formed by the following method. That is, resin thin film layers are formed through the application of liquid insulative material on the entire surfaces by spin coating, or through chemical vapor deposition (CVD) or physical vapor deposition (PVD) utilizing plasma surface treatment technology.

Alternatively, insulating resin sheets may be laminated on both sides of the base substrate 1 in a single process by a sheet lamination method. The insulative resin thin film layers 3 are composed of, as a main component, any one of such resins as epoxy resins, silicone resins, polyimide resins, polyolefin resins, cyanate ester resins, phenol resins, and naphthalene resins, for example. Where lying on the electrode pad parts 2, the insulative resin thin film layers 3 have a thickness of around 20 to 80 $\mu$m, for example.

Next, portions of the insulative resin thin film layers 3 lying above the electrode pad parts 2 are selectively removed to form openings 4 in the insulative resin thin films. The openings 4 can be formed by photolithography-based exposure and development when the insulative resin thin film layers 3 are made of photosensitive material. When the insulative resin thin film layers 3 are made of non-photosensitive material, the openings 4 can be formed in the insulative resin thin films by using laser beam machining technology, or through the formation of photoresist patterns followed by dry etching utilizing plasma surface treatment technology.

Next, as shown in FIG. 4D, metal thin film layers 5 are formed over the entire surfaces including the openings 4 in order to form metal thin film wiring parts on the insulative resin thin film layers 3. The metal thin film layers 5 can be formed in the following manner. A thin film of Ti, Cr, Cu, Mo, W, or other metal, or an alloy thereof is formed by sputtering or other methods as a bonding metal layer for the electrode pad parts 2. Then, a thin film of Cu, Al, Ni, or other metal, or an alloy thereof is consecutively formed thereon by sputtering, CVD, electroless plating, or other methods as an electrode material layer. The thickness of the metal thin film layer 5, i.e., the total thickness of the bonding metal layer and the electrode material layer is approximately 0.2 to 2 $\mu$m, for example.

Figure 5A:
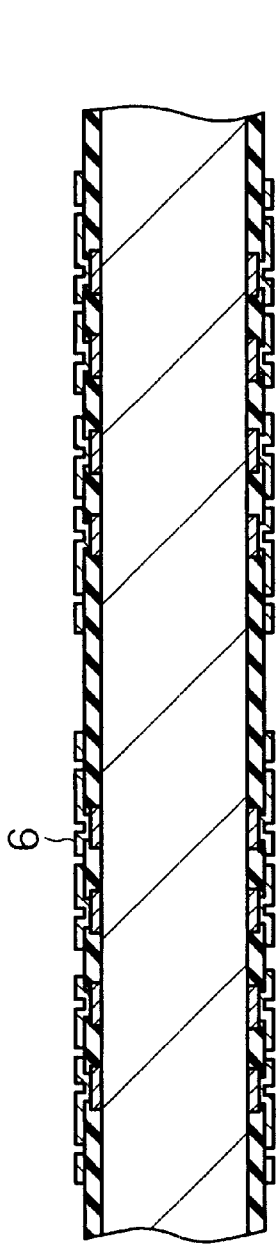
FIGS. 5A through 5C are sectional views showing the steps subsequent to that of FIG. 4D.

Subsequently, as shown in FIG. 5A, photoresist coating is followed by exposure and development to remove predetermined wiring patterns, thereby forming photoresist patterns. The metal thin film layers 5 are electroplated with Cu or the like at portions not covered under the photoresist, forming wiring patterns made of Cu plated layers. Then, the photoresist is removed off. With the wiring patterns as a mask, the underlying metal thin film layers 5 are etched off to form metal thin film wiring parts 6 which are made of the bonding metal layer, the electrode material layer, and the Cu plated layer (so-called semi-additive method). The metal thin film wiring parts 6 have portions electrically isolated from one another, each of which is connected to two adjoining electrode pad parts 2. The metal thin film wiring parts 6 are thicker than the metal thin film layers 5 by the thickness of the Cu plated layer. The thickness of the metal thin film wiring parts 6, i.e., the sum of the thickness of the metal thin film layer 5 including the bonding metal layer and the thickness of the electrode material layer and the Cu plated layer is approximately 5 to 50 $\mu$m, for example.

When the metal thin film wiring parts 6 have a pattern pitch as extremely small as 20 $\mu$m or below, the metal thin film layers 5 can be patterned to form the metal thin film wiring parts 6. That is, the metal thin film layers 5 are coated with a photoresist and subjected to exposure and development such that predetermined wiring patterns are left. Then, by wet etching or by dry etching utilizing plasma surface treatment technology, the metal thin film layers 5 are selectively etched off at portions not covered under the photoresist that is patterned to the wiring pattern. Subsequently, the photoresist can be removed to form the metal thin film wiring parts 6. In this case, the metal thin film wiring parts 6 have substantially the same thickness as that of the metal thin film layers 5.

Figure 5B:
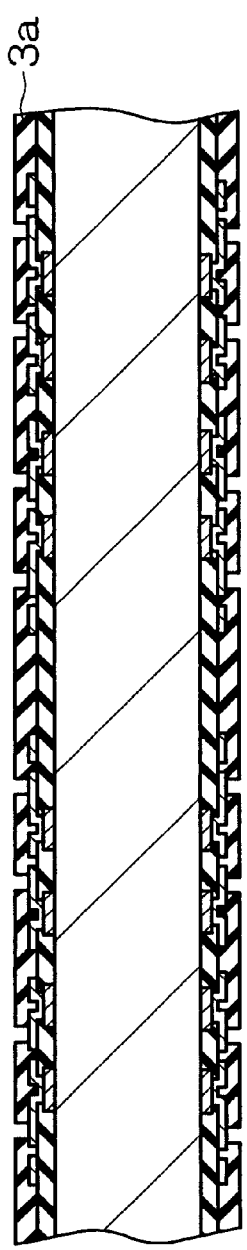
Figure 5C:
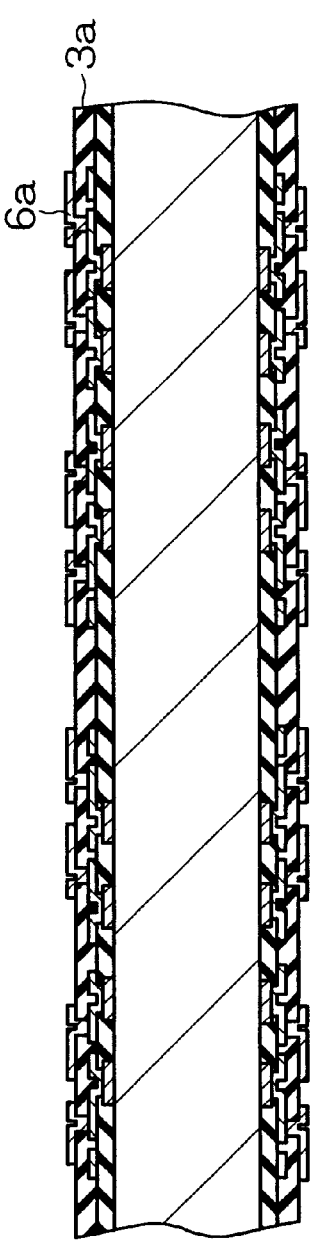
Figure 6A:
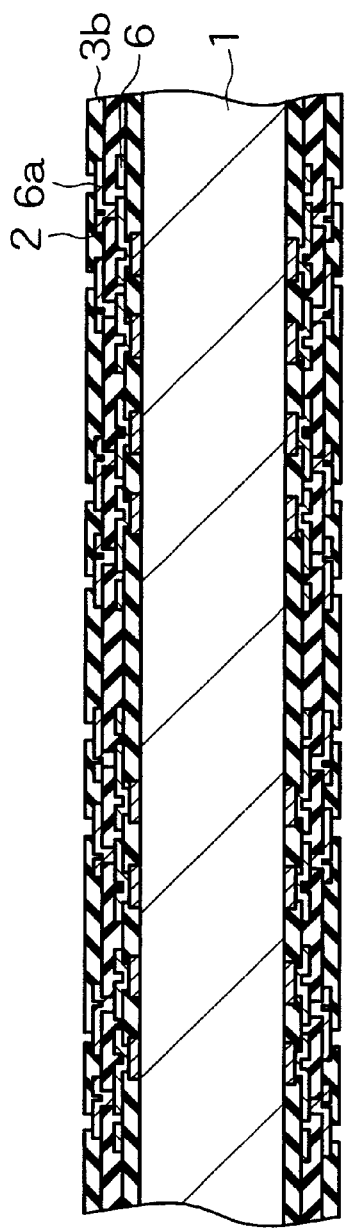
FIGS. 6A through 6C are sectional views showing the steps subsequent to that of FIG. 5C.

Next, as shown in FIGS. 5B, 5C, and 6A, the steps of forming insulative resin thin film layers 3a, forming metal thin film wiring parts 6a, and forming insulative resin thin film layers 3b are repeated in a predetermined pattern to form a predetermined multilayer wiring structure. More specifically, as shown in FIG. 6A, the multilayer metal wiring of double-layer structure is formed in which the electrode pad parts 2 are formed on the base substrate 1, the metal thin film wiring parts 6 of the first layer are formed in connection with the electrode pad parts 2, and metal thin film wiring parts 6a of the second layer are formed in connection with the metal thin film wiring parts 6 of the first layer.

Figure 6B:
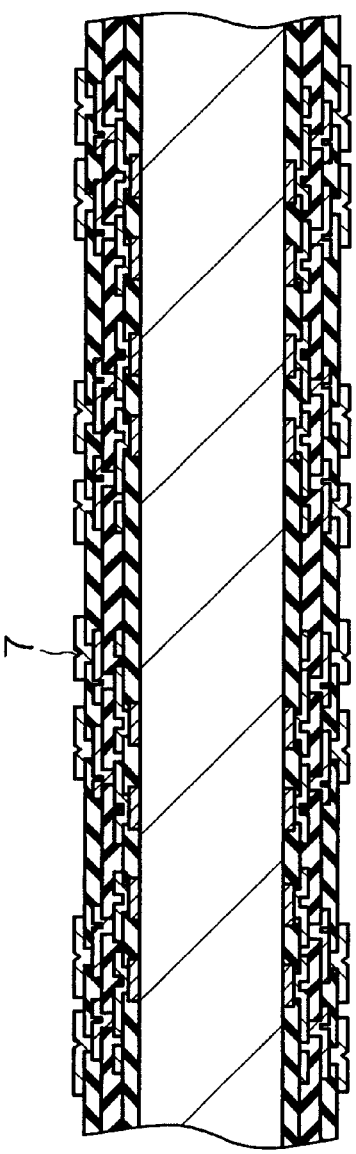

Next, as shown in FIG. 6B, a predetermined pattern of external electrode pad parts 7 each including a metal thin film and a plated layer is formed on the outermost (topmost) insulative resin thin film layers 3b by using the above-described techniques for forming metal thin film wiring. The pattern of the external electrode pad parts 7 corresponds to a predetermined external terminal electrode pattern. Here, the external electrode pad parts 7 have the same thickness as that of the electrode pad parts 2, falling within the range of approximately 11.3 and 63 $\mu$m, for example.

Figure 6C:
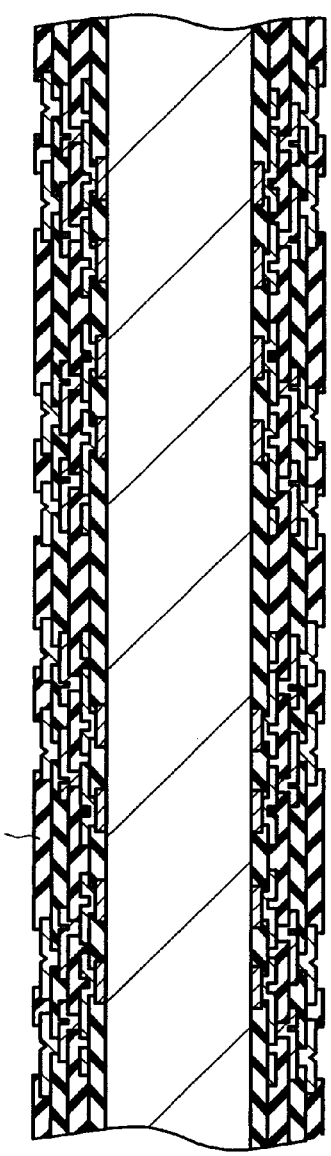

Subsequently, as shown in FIG. 6C, solder resist films 8 are formed over the entire surfaces in order to protect the multilayer wiring structure and the external electrode pad parts 7. Where lying on the external electrode pad parts 7, the solder resist films 8 have a thickness of approximately 10 to 60 $\mu$m, for example. Then, portions of the solder resist film 8 lying on the external electrode pad parts 7 are exclusively removed to form openings. The openings are formed by the following method. When the solder resist films 8 are made of non-photosensitive material, for example, they are given photoresist coating. The photoresist is then patterned through exposure and development. With the photoresist patterns as a mask, the openings are formed in the solder resist films 8 by wet etching or by dry etching utilizing plasma surface treatment technology. When the solder resist films 8 are made of photosensitive material, the solder resist films 8 may be subjected as-is to exposure and development to form the openings. As a result, the solder resist films 8 can cover the ends of the external electrode pad parts 7 to protect the external electrode pad parts 7. When the insulative resin thin film layers 3, 3a, and 3b in the multilayer wiring structure shown in FIG. 6B have extremely high reliability against mechanical and chemical stresses, the solder resist film 8 need not be formed.

Figure 7A:
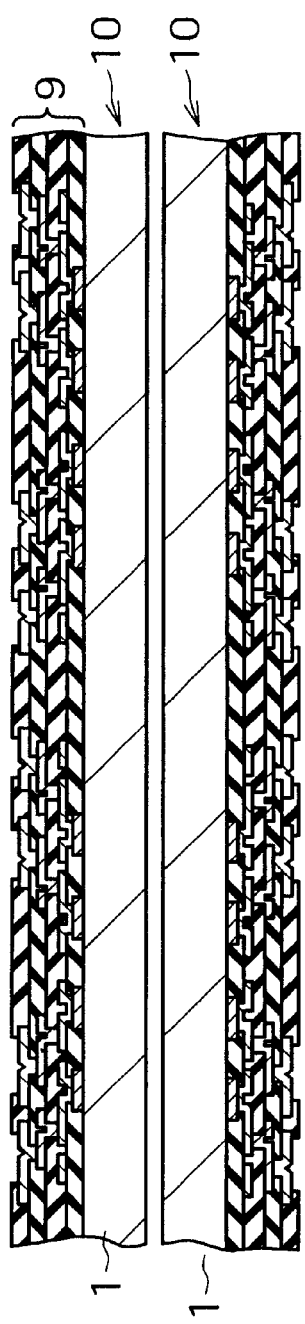
FIGS. 7A through 7C are sectional views showing the steps subsequent to that of FIG. 6C.

Next, as shown in FIG. 7A, the base substrate 1 is split in two in parallel with its surface.

Figure 7B:
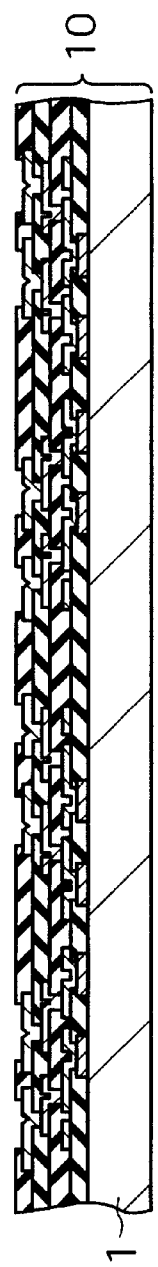

Consequently, two base substrate integrated type multilayer thin film wiring boards 10 are obtained each having multilayer thin film wiring 9 formed on a base substrate 1 as shown in FIG. 7B. Since the base substrate 1 is made of a metal plate having excellent machinability, it can be readily split in two by using a machining system for ordinary metal plate machining.

Figure 7C:
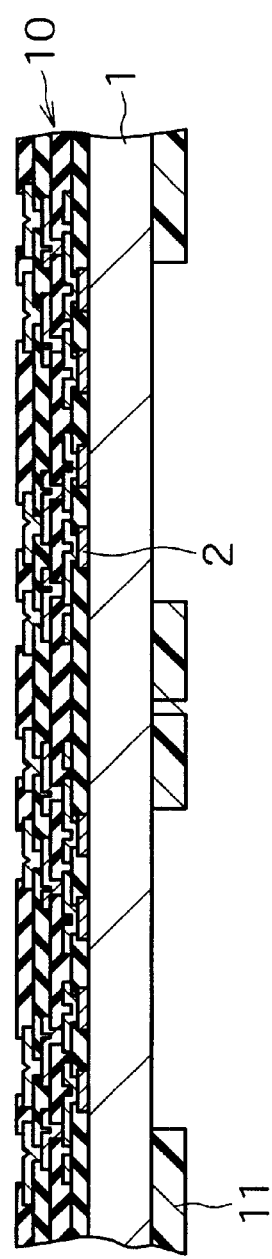

Next, as shown in FIG. 7C, a photoresist layer 11 is formed on the surface of the base substrate 1 of the base substrate integrated type multilayer thin film wiring board 10 split. The photoresist layer 11 is patterned so that the substrate 1 is exposed at regions consistent with the locations where the electrode pad parts 2 of the multilayer thin film wiring 9 are formed. Then, the base substrate 1 is chemically etched with the photoresist layer 11 as a mask.

Consequently, as shown in FIG. 8A, the electrode pad parts 2 of the multilayer thin film wiring 9 are exposed. Then, the photoresist layer 11 is removed to obtain a stiffener (support frame) integrated type multilayer thin film wiring board 12.

The base substrate 1 is chemically etched in the following manner. When the base substrate 1 is made of Cu type metal material, the Cu type metal material can be selectively etched by using a cupric chloride aqueous solution or an ammonia-based alkali etchant. When the base substrate 1 is made of stainless steel (SUS) type metal material, the base substrate 1 can be selectively etched by using a ferric chloride aqueous solution. Here, the electrode pad parts 2 have such a layer structure that an Au layer lies at the surface (at the bottom during formation). The electrode pad parts 2 are thus chemically stable against the cupric chloride aqueous solution, the ammonia-based alkali etchant, and the ferric chloride aqueous solution, the Au layer being unaffected. This prevents the electrode pad parts 2 from disappearing while the base substrate 1 is selectively etched off.

Figure 9A:
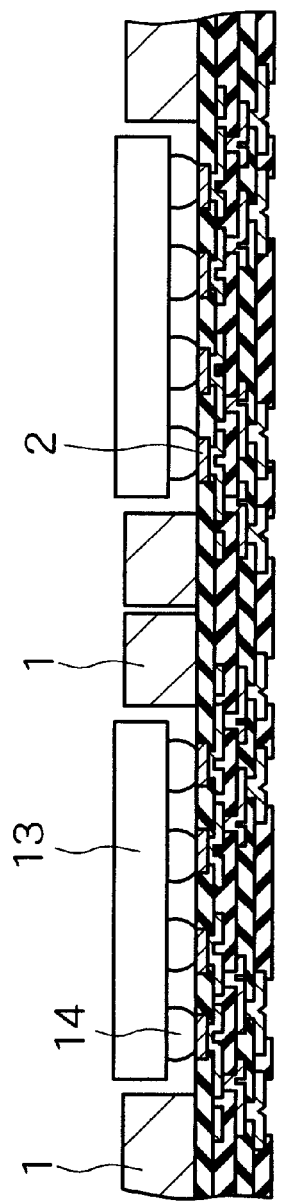
FIGS. 9A through 9C are sectional views showing the steps subsequent to that of FIG. 8B.

Next, as shown in FIG. 8B, the stiffener integrated type multilayer thin film wiring board 12 is turned upside down. As shown in FIG. 9A, flip chip type semiconductor chips 13 are mounted thereon.

More specifically, as shown in FIG. 9A, the flip chip type semiconductor chips 13 are mounted on the stiffener integrated type multilayer thin film wiring board 12 with their bump electrodes 14 downward and with the bump electrodes 14 aligned to the electrode pad parts 2 of the multilayer thin film wiring 9, followed by flip chip mounting processing. Here, if the bump electrodes 14 of the flip chip type semiconductor chips 13 are made of solder that includes, as a main component, such metal material as Sn and Pb, the flip chip mounting can be carried out by a heat reflow process using flux. When the bump electrodes 14 are made of, as a main component, such metal material as Au and In, the flip chip mounting can be carried out by thermo-compression bonding.

Figure 9B:
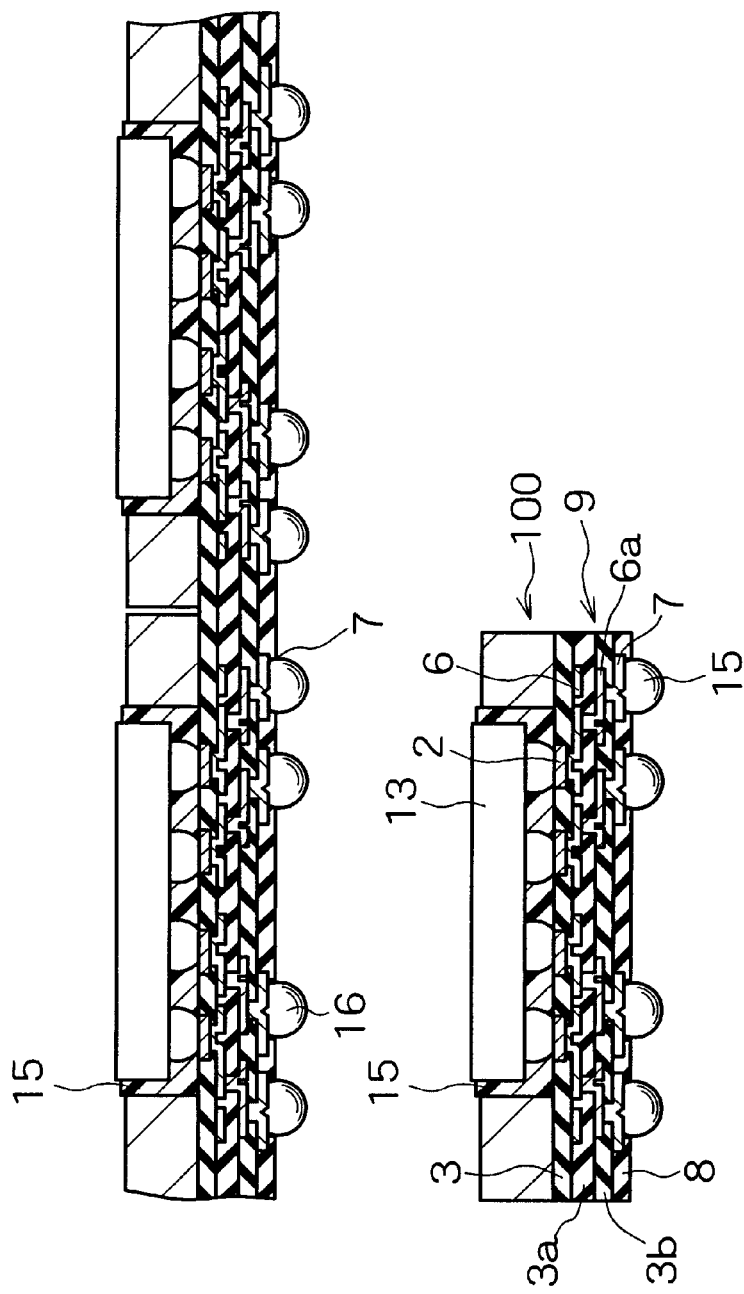

Then, as shown in FIG. 9B, an insulative sealing resin 15 is arranged between the sides of the flip chip type semiconductor chips 13 and the flip chip connecting portions and on the exposed regions of the multilayer thin film wiring board 12 in order that the flip chip type semiconductor chips 13, the flip chip connecting portions, and the multilayer thin film wiring board 12 shall be protected.

The insulative sealing resin can be arranged by a resin injection technique using vacuum sealing technology, a transfer sealing technique, a sealing technique using liquid underfill material, or the like. The underfill resin may include, as a main component, any one of such resins as epoxy resins, silicone resins, polyimide resins, polyolefin resins, cyanate ester resins, phenol resins, and naphthalene resins.

Subsequently, solder balls 16 including Sn or other metal material as a main component are mounted as external terminals on the external electrode pad parts 7 which lie on the side opposite from the electrode pad parts 2. Here, the solder balls 16 can be mounted on the external electrode pad parts 7 by selectively applying flux to the external electrode pad parts 7, covering the same with the solder balls 16, and then applying heat by an IR reflow process.

Figure 9C:
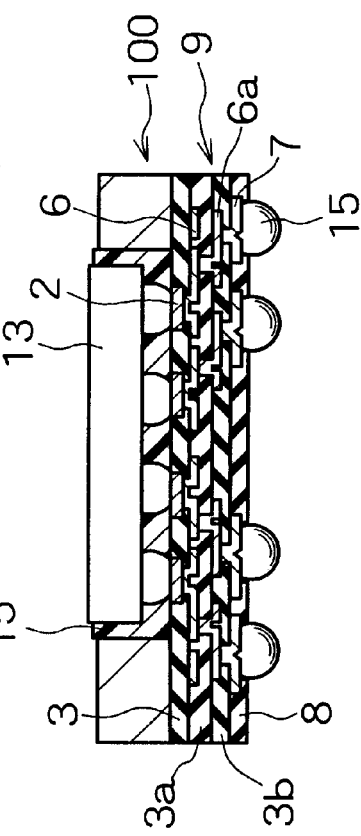

Then, as shown in FIG. 9C, flip chip type semiconductor devices are separated into pieces by a cutting technique using a dicing blade or the like. Consequently, flip chip type semiconductor devices 100 are obtained.

As shown in FIG. 9C, a flip chip type semiconductor device 100 according to the present embodiment has multilayer thin film wiring 9. The multilayer thin film wiring 9 has a metal four-layer structure in which a solder resist film 8, external electrode pad parts 7, an insulative resin thin film layer 3b, metal thin film wiring parts 6a, an insulative resin thin film layer 3a, metal thin film wiring parts 6, an insulative resin thin film layer 3, and electrode pad parts 2 are laminated in this order. The external electrode pad parts 7 are connected to the metal thin film wiring parts 6a through openings in the insulative resin thin film layer 3b. The metal thin film wiring parts 6a are connected to the metal thin film wiring parts 6 through openings in the insulative resin thin film layer 3a. The metal thin film wiring parts 6 are connected to the electrode pad parts 2 through openings in the insulative resin thin film layer 3. Examples of the thicknesses of the individual layers constituting the multilayer thin film wiring 9 are as follows: 10–60 $\mu$m for the solder resist film 8; 11.3–63 $\mu$m for the external electrode pad parts 7; 20–80 $\mu$m for the insulative resin thin film layer 3b; 5–50 $\mu$m for the metal thin film wiring parts 6a; 20–80 $\mu$m for the insulative resin thin film layer 3a; 5–50 $\mu$m for the metal thin film wiring parts 6; and 11.3–63 $\mu$m for the electrode pad parts 2. Hence, the multilayer thin film wiring 9 has a total thickness of 102 to 526 $\mu$m, for example.

The electrode pad parts 2 of the multilayer thin film wiring 9 are connected with the bump electrodes 14 of a flip chip type semiconductor chip 13. The single flip chip type semiconductor chip 13 is thus mounted on the surface of the electrode pad parts 2 of the multilayer thin film wiring 9. A stiffener (support frame) made of Cu type metal material or stainless steel type metal material is joined to part of the region on the surface of the electrode pad parts 2 of the multilayer thin film wiring 9 where the flip chip type semiconductor chip 13 is not mounted. The stiffener is formed by selectively removing the plate-like base substrate 1 (see FIG. 7C). Furthermore, the insulative sealing resin 15 is filled into between the multilayer thin film wiring 9 and the flip chip type semiconductor chip 13 and between the stiffener and the flip chip type semiconductor chip 13. Meanwhile, solder balls 16 are mounted on the external electrode pad parts 7 of the multilayer thin film wiring 9.

According to the present embodiment, it is possible to provide the method of manufacturing a multilayer wiring board in which the multilayer thin film wiring 9 can be maintained at high flatness. The multilayer thin film wiring 9 is thus prevented from internal stress. That is, in the present embodiment, the multilayer wiring structure (multilayer thin film wiring 9) is formed on the base substrate 1 having high flatness. This also enhances the flatness of the multilayer thin film wiring 9 with no distortion nor much internal stress. It is therefore possible to form fine wiring which is high in thermal stability during the formation of the multilayer thin film wiring, high in manufacturing yield, and is 10 $\mu$m or less in line & space. After the multilayer thin film wiring 9 is formed on both sides of the base substrate 1 and the flip chip type semiconductor chips 13 are mounted thereon, the base substrate is split in two to produce two semiconductor devices out of the two sides of the base substrate. This allows effective use of the multilayer wiring formed on the base substrate 1, doubling the production per a single manufacturing process as compared to heretofore with an improvement in productivity and a reduction in manufacturing cost.

While the present embodiment has dealt with the case where the multilayer thin film wiring 9 has the metal four-layer structure, the multilayer thin film wiring may have a metal double-layer structure including a solder resist film/external electrode pad parts/an insulative resin thin film layer/electrode pad parts. Given that the individual layers have the same thicknesses as stated before, the multilayer thin film wiring here has a total thickness of 52 to 266 μm, for example. The multilayer thin film wiring may have a metal three-layer structure including a solder resist film/ external electrode pad parts/an insulative resin thin film layer/metal thin film wiring parts/an insulative resin thin film layer/electrode pad parts. In this case, the multilayer thin film wiring has a total thickness of 77 to 396 μm, for example. Moreover, the multilayer thin film wiring may have a metal five-layer structure including a solder resist film/external electrode pad parts/an insulative resin thin film layer/metal thin film wiring parts/an insulative resin thin film layer/metal thin film wiring parts/an insulative resin thin film layer/metal thin film wiring parts/an insulative resin thin film layer/electrode pad parts. In this case, the multilayer thin film wiring has a total thickness of 127 to 656 μm, for example. Furthermore, the multilayer thin film wiring may have a metal six-layer structure including a solder resist film/external electrode pad parts/an insulative resin thin film layer/metal thin film wiring parts/an insulative resin thin film layer/metal thin film wiring parts/an insulative resin thin film layer/metal thin film wiring parts/ an insulative resin thin film layer/metal thin film wiring parts/an insulative resin thin film layer/electrode pad parts. In this case, the multilayer thin film wiring has a total thickness of 152 to 786 μm, for example.

Now, description will be given of a second embodiment of the present invention. FIG. 10 is a sectional view showing a flip chip type semiconductor device according to the second embodiment of the present invention. Flip chip type semiconductor chips are typically applied to high pin count devices of high speed logic type, in which case it matters how heat radiation is secured of the semiconductor chips. This second embodiment provides a flip chip type semiconductor device improved in thermal property.

That is, in the second embodiment, a radiative adhesive 17 is applied to the backside of the flip chip type semiconductor chip 13 and an adhesive 18 is applied to the stiffener of the stiffener integrated type multilayer thin film wiring board 12, i.e., the base substrate 1. A heat spreader 19 is joined via the radiative adhesive 17 and the adhesive 18. The semiconductor chip can thus be enhanced in heat radiation property. The effects of the present embodiment other than mentioned above are the same as those of the foregoing first embodiment.

The heat spreader 19 for heat radiation may be made of Cu, Al, W, Mo, Fe, Ni, Cr, or other metal, or an alloy thereof. Alternatively, the heat spreader 19 may be made of ceramic material such as alumina, AlN, SiC, and mullite.

The radiative adhesive 17 includes, as a main component, any one of such resins as epoxy resins, silicone resins, polyimide resins, polyolefin resins, cyanate ester resins, phenol resins, and naphthalene resins. The radiative adhesive 17 further includes material such as Ag, Pd, Cu, Al, Au, Mo, W, diamond, alumina, AlN, mullite, BN, and SiC in addition to the main component.

Now, description will be given of a third embodiment of the present invention. FIGS. 11A through 11C are sectional views of a flip chip type semiconductor device according to the present embodiment, showing the method of manufacturing the same in the order of steps. FIGS. 12A and 12B are sectional views showing the steps subsequent to that of FIG. 1C. As shown in FIG. 11A, the base substrate of the present embodiment is a three-layer metal clad material including two metal layers 20 and an intermediate metal layer 21 sandwiched therebetween. This three-layer metal clad material is configured such that (the metal layer 20/the intermediate metal layer 21/the metal layer 20) are made of (Cu layer/Al layer/Cu layer), (SUS layer/Al layer/SUS layer), or (SUS layer/Cu layer/SUS layer), respectively.

Next, as shown in FIG. 11B, electrode pad parts 2 of predetermined pattern are formed on both sides of the three-layer metal clad material, i.e., on both the outer surfaces of the metal layers 20 as in the first embodiment.

Then, as shown in FIG. 11C, predetermined multilayer thin film wiring 9 is formed on both sides of the three-layer metal clad material, i.e., on both the outer surfaces of the metal layers 20 as in the first embodiment.

Next, as shown in FIG. 12A, only the intermediate metal layer 21 of the three-layer metal clad material is selectively removed by chemical wet etching, so that the two metal layers 20 are separated from each other.

Consequently, two boards are obtained each having the multilayer thin film wiring 9 formed on the metal layers 20 as shown in FIG. 12B. When the intermediate metal layer 21 of the three-layer metal clad material is made of Al, the chemical wet etching of the intermediate metal layer 21 can be effected by using an alkali aqueous solution such as a TMAH (tetramethylammonium hydroxide) aqueous solution. When the intermediate metal layer 21 of the three-layer metal clad material is made of Cu, a cupric chloride based etchant or a sulfuric acid-hydrogen peroxide mixture based etchant is used. Subsequently, the same steps as in the first embodiment can be taken to obtain predetermined semiconductor devices. As a result, in the present embodiment, the base substrate can be split in two more easily and in shorter time than in the foregoing first embodiment. The effects of the present embodiment other than mentioned above are the same as those of the foregoing first embodiment.

Next, a fourth embodiment of the present invention will be described with reference to FIG. 13. FIG. 13 is a sectional view showing the method of manufacturing a flip chip type semiconductor device according to the present embodiment. This fourth embodiment is an improvement of the third embodiment in which the intermediate metal layer 21 of the three-layer metal clad material can be selectively etched off with greater facility.

The fourth embodiment uses a five-layered substrate which includes two intermediate metal layers 21, a porous film 22 having excellent liquid permeability sandwiched therebetween, and metal layers 20 arranged on the outer surfaces of the intermediate metal layers 21. Specifically, this base substrate is a five-layered substrate such that (the metal layer 20/the intermediate layer 21/the porous film 22/the intermediate metal layer 21/the metal layer 20) are made of (Cu layer/Al layer/a porous film/Al layer/Cu layer), (SUS layer/Al layer/a porous film/Al layer/SUS layer), or (SUS layer/Cu layer/a porous film/Cu layer/SUS layer), respectively. The porous film 22 is made of porous polyimide, for example.

The base substrate configured thus has the effect of facilitating the step of selectively removing the intermediate metal layer of FIG. 12A in the third embodiment by chemical etching. Specifically, at the time of chemical etching, the chemical etchant permeates into the center of the base substrate through the porous film 22 readily at speed since the porous film 22 has excellent liquid permeability. The intermediate metal layers 21 can thus be removed easily. This stabilizes the process of etching off the intermediate metal layers 21 made of Al, Cu, or other metal with a reduction in process time. The fourth embodiment is thus effective in stabilizing the quality of the semiconductor device and reducing the cost of the same. Incidentally, the number of intermediate layers 21 may be one. Each single intermediate layer 21 may be sandwiched between two porous films 22.

Now, description will be given of fifth to eighth embodiments of the invention. The embodiments are intended to facilitate splitting the base substrate in two without using a base substrate that has the intermediate metal layer(s) 21 at its center as in the third and fourth embodiments.

FIG. 14A is a sectional view showing the fifth embodiment of the present invention. FIG. 14B is a perspective view thereof. The fifth embodiment uses a base substrate that includes stacked two single-layer metal plates 30 made of Cu or stainless steel (SUS). The two single-layer metal plates 30 are bound to each other with metal pins 23 which are stuck into the four corners of the metal plates 30. That is, the two single-layer metal plates 30 are integrated by the metal pins 23. On this base substrate composed of the stacked two metal plates, the multilayer thin film wiring 9 is formed through the steps described previously. Then, the metal pins 23 can be removed to separate the two metal plates 30. The metal pins 23 are stuck into the metal plates 30 to join the metal plates 30 frictionally. When the intensity of this frictional joint force is adjusted properly, the metal plates 30 can be kept from separation during the steps of forming thin films before the metal plates 30 are separated easily by applying pulling forces between the metal plates 30 to withdraw the metal pins 23 off the metal plates 30. The metal plates 30 may be separated by cutting off the four corners including the metal pins 23 from the main body of the base substrate which is composed of the metal plates 30.

Figure 15:
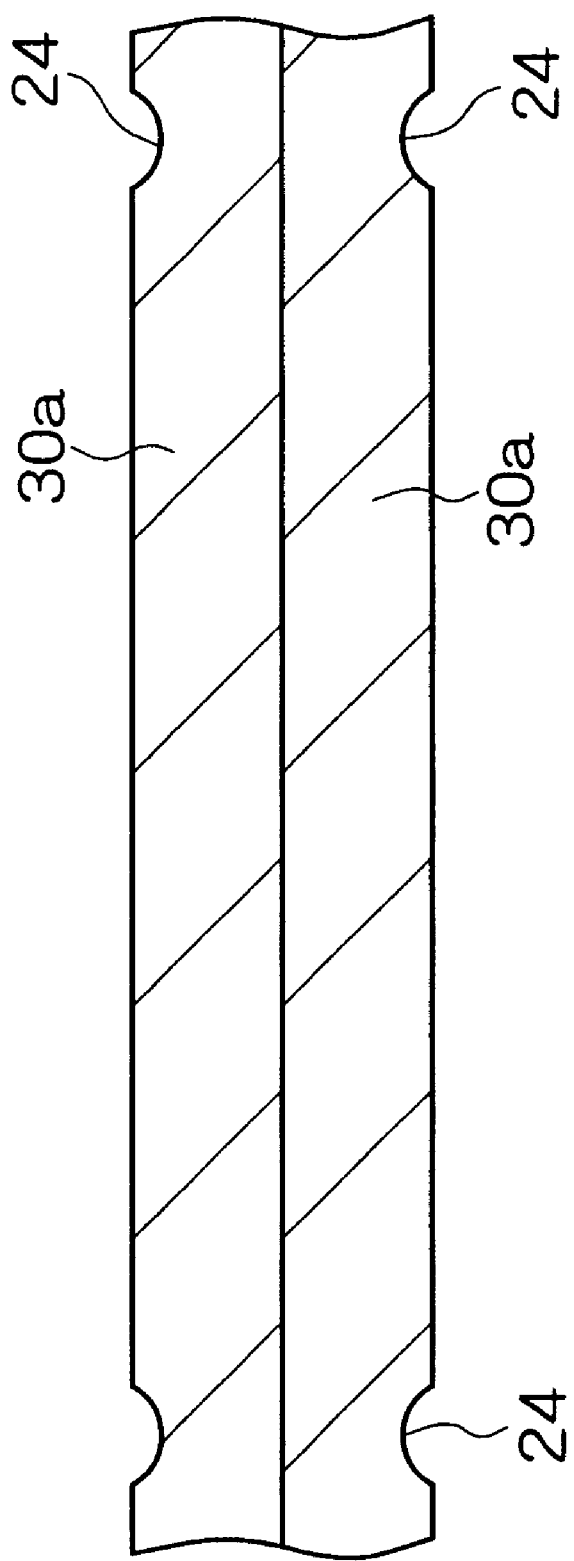
FIG. 15 is a sectional view showing a method of manufacturing a flip chip type semiconductor device according to a sixth embodiment of the present invention.

Next, a sixth embodiment of the present invention will be described with reference to FIG. 15. FIG. 15 is a sectional view showing the method of manufacturing a flip chip type semiconductor device according to the present embodiment. The sixth embodiment uses a base substrate that includes stacked two single-layer metal plates 30a made of Cu or stainless steel (SUS). Partial welds 24 are formed along the edges of the metal plates 30a by using weld metalworking techniques. More specifically, the edges of the stacked metal plates 30a are spot-welded or the edges are welded along the periphery of the metal plates 30a to join the two metal plates 30a to each other. Then, the multilayer thin film wiring 9 is formed through the steps described previously. The two metal plates 30a can be separated from each other by cutting off the edges including the partial welds 24 from the main body of the base substrate that is composed of the metal plates.

Figure 16:
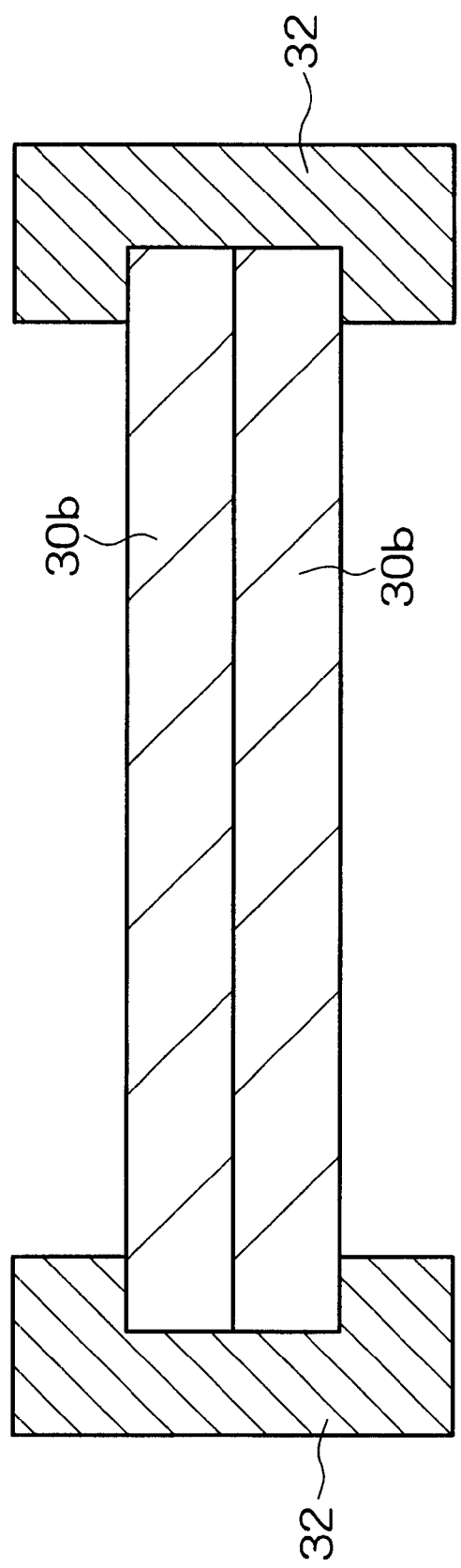
FIG. 16 is a sectional view showing a method of manufacturing a flip chip type semiconductor device according to a seventh embodiment of the present invention.

Next, a seventh embodiment of the present invention will be described with reference to FIG. 16. FIG. 16 is a sectional view showing the method of manufacturing a flip chip type semiconductor device according to the present embodiment. The seventh embodiment uses a base substrate that includes stacked two metal plates 30b made of Cu or stainless steel (SUS). The edges of the metal plates 30b are fit and confined to the recesses of U-sectioned fixtures 32 so that the metal plates 30b are maintained as stacked each other. In the seventh embodiment, the two metal plates 30b can be separated from each other by simply releasing the fixtures 32.

Figure 17:
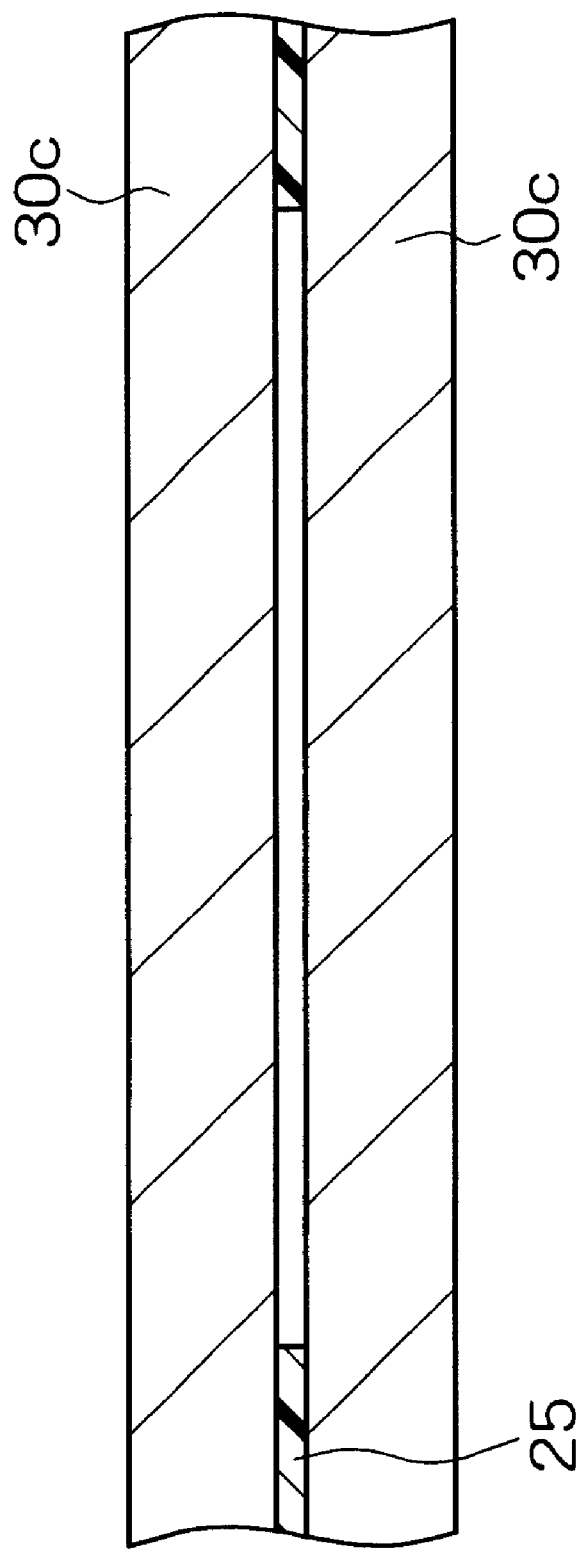
FIG. 17 is a sectional view showing a method of manufacturing a flip chip type semiconductor device according to an eighth embodiment of the present invention.

Next, an eighth embodiment of the present invention will be described with reference to FIG. 17. FIG. 17 is a sectional view showing the method of manufacturing a flip chip type semiconductor device according to the present embodiment. The eighth embodiment uses a base substrate that includes two single-layer metal plates 30c made of Cu or stainless steel (SUS). The edges of the two metal plates 30c are coated with an adhesive 25, by which the metal plates 20c are joined to each other. In the eighth embodiment, the adhesive 25 can be released to separate the two metal plates 30c from each other after the formation of multilayer thin film wiring.

Figure 18A:
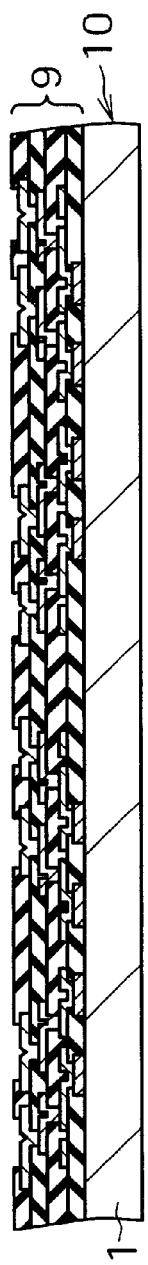
FIGS. 18A through 18C are sectional views of a flip chip type semiconductor device according to a ninth embodiment of the present invention, showing the method of manufacturing the same in the order of steps.
Figure 18B:
Figure 18C:
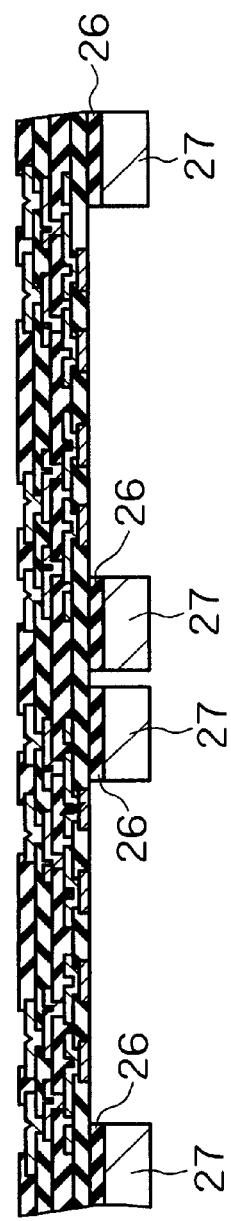

Now, description will be given of a ninth embodiment of the present invention. FIGS. 18A through 18C are sectional views of a flip chip type semiconductor device according to the present embodiment, showing the method of manufacturing the same in the order of steps. Initially, a base substrate integrated type wiring board 10 having the multilayer thin film wiring 9 formed on its base substrate 1 is fabricated by the same steps as in the foregoing first embodiment, i.e., the steps shown in FIGS. 4A–4D, 5A–5C, 6A–6C, 7A, and 7B.

Next, as shown in FIG. 18A, the base substrate 1 is subjected to overall chemical etching so that the entire base substrate 1 is removed. Consequently, multilayer thin film wiring 9 in film form is obtained as shown in FIG. 18B. Next, as shown in FIG. 18C, an insulative adhesive 26 is applied to the film of multilayer thin film wiring 9. Then, a stiffener (metal reinforcing plate) 27 made of metal or an alloy is bonded to the multilayer thin film wiring 9 via the insulative adhesive 26. Subsequently, by the same steps as in the foregoing first embodiment, i.e., the steps shown in FIGS. 8B and 9A–9C, flip chip type semiconductor chips 13 and solder balls 16 are mounted on the multilayer thin film wiring 9 to fabricate flip chip type semiconductor devices.

In the flip chip type semiconductor device according to the present embodiment, the stiffener 27 is bonded to the multilayer thin film wiring 9 with the insulative adhesive 26 after the complete removal of the base substrate 1, not formed by the selective removal of the base substrate 1 (see FIG. 7C) as in the flip chip type semiconductor device 100 (see FIG. 9C) according to the foregoing first embodiment. In respects other than those described above, the flip chip type semiconductor device according to the present embodiment is configured the same as in the foregoing first embodiment.

In the present embodiment, it is possible to obtain the multilayer thin film wiring 9 in film form. Then, the multilayer thin film wiring 9 in film form can be easily applied to manufacturing process facilities which transport film articles typified by TAB (Tape Automated Bonding) tapes. As above, since the multilayer thin film wiring 9 is applicable to many existing board-associated manufacturing facilities, it is advantageously easy to cut down the cost of facility investment and promote the industrial standardization of facility specifications. This eventually allows a reduction in manufacturing cost. The effects of the present embodiment other than described above are the same as those of the foregoing first embodiment.

What is claimed is:

1. A flip chip type semiconductor device, comprising:
   multilayer thin film wirings including an inner electrode pad formed on one side thereof and an outer electrode pad formed on the other; and
   a flip chip type semiconductor chips mounted on said multilayer thin film wiring so that a bump electrode thereof is connected with said inner electrode pad of said multilayer thin film wiring,
   said multilayer thin film wirings being formed by forming said multilayer thin film wirings on both front and back surfaces of a base substrate having body parts made of metal or an alloy at both said front and back surfaces, each of said multilayer thin film wiring including an inner electrode pad formed on a surface of said multilayer thin film wiring closer to said base substrate and an outer electrode pad formed on an opposite surface not close to said base substrate, and then splitting said base substrate into said front surface side and said back surface side, and removing at least part of said body parts of said base substrates to expose said inner electrode pad.

2. The flip chip type semiconductor device according to claim 1, wherein said multilayer thin film wiring is separated by semiconductor chip after said semiconductor chip is mounted thereon.

3. The flip chip type semiconductor device according to claim 1, further comprising:
   a stiffener part made of said base substrate remaining in a region of said multilayer thin film wiring where said semiconductor chip is not mounted on; and
   an insulative sealing resin arranged between said semiconductor chip and said stiffener part and between said semiconductor chip and said multilayer thin film wiring.

4. The flip chip type semiconductor device according to claim 1, further comprising a solder ball joined to said outer electrode pad of said multilayer thin film wiring.

5. The flip chip type semiconductor device according to claim 1, further comprising a heat spreader for cooling said semiconductor chip, being joined to said semiconductor chip.

6. The flip chip type semiconductor device according to claim 5, wherein said heat spreader is made of a material selected from the group consisting of metallic materials including Cu, Al, W, Mo, Fe, Ni, and Cr, and ceramic materials including alumina, AlN, SiC, and mullite.

7. The flip chip type semiconductor device according to claim 5, wherein said heat spreader is joined to said semiconductor chip with a heat conductive adhesive including, as a main component, a resin selected from the group consisting of epoxy resins, silicone resins, polyimide resins, polyolefin resins, cyanate ester resins, phenol resins, and naphthalene resins, and further including a material selected from the group consisting of Ag, Pd, Cu, Al, Au, Mo, W, diamond, alumina, AlN, mullite, BN, and SiC.

8. The flip chip type semiconductor device according to claim 1, wherein said multilayer thin film wiring is a wiring layer having a multilayer structure formed by forming and patterning an insulative resin thin film and forming and pattering a conductive thin film.

9. The flip chip type semiconductor device according to claim 8, wherein said insulative resin thin film includes, as a main component, a resin selected from the group consisting of epoxy resins, silicone resins, polyimide resins, polyolefin resins, cyanate ester resins, phenol resins, and naphthalene resins.

10. The flip chip type semiconductor device according to claim 1, wherein said multilayer thin film wiring includes:
    an insulative resin thin film formed to cover said inner electrode pad, having an opening in part of a region consistent with said inner electrode pad; and
    a solder resist film for covering an end of said outer electrode pad,
    said multilayer thin film wiring having a metal double-layer structure including said inner electrode pad, said insulative resin thin film, said outer electrode pad formed on said insulative resin thin film and connected to said inner electrode pad through said opening, and said solder resist film.

11. The flip chip type semiconductor device according to claim 10, wherein said multilayer thin film wiring has a total thickness of 52 to 266 $\mu$m.

12. The flip chip type semiconductor device according to claim 1, wherein said multilayer thin film wiring includes:
    a first insulative resin thin film formed to cover said inner electrode pad, having a first opening in part of a region consistent with said inner electrode pad;
    a wiring part formed on said first insulative resin thin film and connected to said inner electrode pad through said first opening;
    a second insulative resin thin film formed to cover said wiring part, having a second opening in part of a region consistent with said wiring part; and
    a solder resist film for covering an end of said outer electrode pad,
    said multilayer thin film wiring having a metal three-layer structure including said inner electrode pad, said first insulative resin thin film, said wiring part, said second insulative resin thin film, said outer electrode pad formed on said second insulative resin thin film and connected to said wiring part through said second opening, and said solder resist film.

13. The flip chip type semiconductor device according to claim 12, wherein said multilayer thin film wiring has a total thickness of 77 to 396 $\mu$m.

14. The flip chip type semiconductor device according to claim 1, wherein said multilayer thin film wiring includes:
    a first insulative resin thin film formed to cover said inner electrode pad, having a first opening in part of a region consistent with said inner electrode pad;
    a first wiring part formed on said first insulative resin thin film and connected to said inner electrode pad through said first opening;
    a second insulative resin thin film formed to cover said first wiring part, having a second opening in part of a region consistent with said first wiring part;
    a second wiring part formed on said second insulative resin thin film and connected to said first wiring part through said second opening;
    a third insulative resin thin film formed to cover said second wiring part, having a third opening in part of a region consistent with said second wiring part; and
    a solder resist film for covering an end of said outer electrode pad,
    said multilayer thin film wiring having a metal four-layer structure including said inner electrode pad, said first insulative resin thin film, said first wiring part, said second insulative resin thin film, said second wiring part, said third insulative resin thin film, said outer electrode pad formed on said third insulative resin thin film and connected to said second wiring part through said third opening, and said solder resist film.

15. The flip chip type semiconductor device according to claim 14, wherein said multilayer thin film wiring has a total thickness of 102 to 526 $\mu$m.

16. The flip chip type semiconductor device according to claim 1, wherein said multilayer thin film wiring includes:
    a first insulative resin thin film formed to cover said inner electrode pad, having a first opening in part of a region consistent with said inner electrode pad;
    a first wiring part formed on said first insulative resin thin film and connected to said inner electrode pad through said first opening;
    a second insulative resin thin film formed to cover said first wiring part, having a second opening in part of a region consistent with said first wiring part;

a second wiring part formed on said second insulative resin thin film and connected to said first wiring part through said second opening;

a third insulative resin thin film formed to cover said second wiring part, having a third opening in part of a region consistent with said second wiring part;

a third wiring part formed on said third insulative resin thin film and connected to said second wiring part through said third opening;

a fourth insulative resin thin film formed to cover said third wiring part, having a fourth opening in part of a region consistent with said third wiring part; and a solder resist film for covering an end of said outer electrode pad, said multilayer thin film wiring having a metal five-layer structure including said inner electrode pad, said first insulative resin thin film, said first wiring part, said second insulative resin thin film, said second wiring part, said third insulative resin thin film, said third wiring part, said fourth insulative resin thin film, said outer electrode pad formed on said fourth insulative resin thin film and connected to said third wiring part through said fourth opening, and said solder resist film.

17. The flip chip type semiconductor device according to claim 16, wherein said multilayer thin film wiring has a total thickness of 127 to 656 $\mu$m.

18. The flip chip type semiconductor device according to claim 1, wherein said multilayer thin film wiring includes:

a first insulative resin thin film formed to cover said inner electrode pad, having a first opening in part of a region consistent with said inner electrode pad;

a first wiring part formed on said first insulative resin thin film and connected to said inner electrode pad through said first opening;

a second insulative resin thin film formed to cover said first wiring part, having a second opening in part of a region consistent with said first wiring part;

a second wiring part formed on said second insulative resin thin film and connected to said first wiring part through said second opening;

a third insulative resin thin film formed to cover said second wiring part, having a third opening in part of a region consistent with said second wiring part;

a third wiring part formed on said third insulative resin thin film and connected to said second wiring part through said third opening;

a fourth insulative resin thin film formed to cover said third wiring part, having a fourth opening in part of a region consistent with said third wiring part;

a fourth wiring part formed on said fourth insulative resin thin film and connected to said third wiring part through said fourth opening;

a fifth insulative resin thin film formed to cover said fourth wiring part, having a fifth opening in part of a region consistent with said fourth wiring part; and a solder resist film for covering an end of said outer electrode pad, said multilayer thin film wiring having a metal six-layer structure including said inner electrode pad, said first insulative resin thin film, said first wiring part, said second insulative resin thin film, said second wiring part, said third insulative resin thin film, said third wiring part, said fourth insulative resin thin film, said fourth wiring part, said fifth insulative resin thin film, said outer electrode pad formed on said fifth insulative resin thin film and connected to said fourth wiring part through said fifth opening, and said solder resist film.

19. The flip chip type semiconductor device according to claim 18, wherein said multilayer thin film wiring has a total thickness of 152 to 786 $\mu$m.

20. A method of manufacturing a flip chip type semiconductor device, comprising the steps of:

forming multilayer thin film wirings on both front and back surfaces of a base substrate having body parts made of metal or an alloy at both said front and back surfaces, each of said multilayer thin film wirings including an inner electrode pad formed on a surface of said multilayer thin film wiring close to said base substrate and an outer electrode pad formed on an opposite surface not close to said base substrate;

splitting said base substrate into said front surface side and said back surface side to form two base substrate integrated type wiring boards;

removing at least part of said body parts of said base substrates to expose said electrode pad; and mounting a plurality of flip chip type semiconductor chips on said inner electrode pad of said multilayer thin film wiring so that bump electrodes thereof are connected with said inner electrode pad.

21. The method of manufacturing a flip chip type semiconductor device according to claim 20, further comprising the step of joining solder balls to said outer electrode pad of said multilayer thin film wiring.

22. The method of manufacturing a flip chip type semiconductor device according to claim 20, further comprising the step of separating said multilayer thin film wiring by each of said semiconductor chips.

23. The method of manufacturing a flip chip type semiconductor device according to claim 20, wherein the step of exposing said inner electrode pad includes the steps of:

applying a photoresist to surfaces of said base substrates so as not to cover regions consistent with said electrode pad; and etching off said base substrates with said photoresist as a mask, thereby forming stiffener integrated type multilayer thin film wiring boards having the remaining portions of said base substrates as stiffener parts.

24. The method of manufacturing a flip chip type semiconductor device according to claim 20, wherein in the step of exposing said inner electrode pad, said base substrates are entirely removed to obtain multilayer thin film wirings in film form exposing said inner electrode pad, and after the step, stiffener parts are joined to at least part of the surface of said multilayer thin film wiring from which said base substrates are removed, excluding regions consistent with said inner electrode pad.

25. The method of manufacturing a flip chip type semiconductor device according to claim 24, wherein said stiffener parts are made of metal or an alloy.

26. The method of manufacturing a flip chip type semiconductor device according to claim 23, further comprising the step of filling a resin into between said semiconductor chips and said stiffener parts and between said semiconductor chips and said multilayer thin film wiring after said semiconductor chips are mounted.

27. The method of manufacturing a flip chip type semiconductor device according to claim 20, wherein a heat spreader for cooling said semiconductor chip is joined to each of said semiconductor chips.

28. The method of manufacturing a flip chip type semiconductor device according to claim 20, wherein said inner electrode pad of said multilayer thin film wiring are plated layers formed by electroplating with said base substrate as a feed layer.

29. The method of manufacturing a flip chip type semiconductor device according to claim 20, wherein said base substrate is made of copper, a copper alloy, or stainless steel.

30. The method of manufacturing a flip chip type semiconductor device according to claim 20, wherein in the step of splitting said base substrate into said front surface side and said back surface side, said base substrate is separated into two base substrate integrated type wiring boards by being cut practically in parallel with its surface.

31. The method of manufacturing a flip chip type semiconductor device according to claim 20, wherein said base substrate has a three-layer structure including metal or alloy body parts on both front and back surfaces and an intermediate metal layer laminated therebetween, and in the step of splitting said base substrate into said front surface side and said back surface side, said intermediate metal layer is etched more selectively than said body parts to separate said base substrate into two.

32. The method of manufacturing a flip chip type semiconductor device according to claim 31, wherein a porous film is laminated on said intermediate metal layer.

33. The method of manufacturing a flip chip type semiconductor device according to claim 20, wherein said base substrate has a five-layer structure including metal or alloy body parts on both front and back surfaces and a three-layer film arranged therebetween, said three-layer film having two intermediate metal layers and a porous film sandwiched therebetween.

34. The method of manufacturing a flip chip type semiconductor device according to claim 20, wherein said base substrate is prepared by stacking two single-layer metal plates made of metal or an alloy, and fixing said single-layer metal plates to each other with a metal or alloy pin sticking therethrough.

35. The method of manufacturing a flip chip type semiconductor device according to claim 20, wherein said base substrate is prepared by stacking two single-layer metal plates made of metal or an alloy, and fixing said single-layer metal plates to each other by local welding.

36. The method of manufacturing a flip chip type semiconductor device according to claim 20, wherein said base substrate is prepared by stacking two single-layer metal plates made of metal or an alloy, and fixing said single-layer metal plates to each other by mechanical binding at their edges.

37. The method of manufacturing a flip chip type semiconductor device according to claim 20, wherein said base substrate is prepared by stacking two single-layer metal plates made of metal or an alloy, and fixing said single-layer metal plates to each other by local bonding with an adhesive.

* * * * *